US011133276B2

(12) United States Patent
Saito

(10) Patent No.: US 11,133,276 B2
(45) Date of Patent: Sep. 28, 2021

(54) SEMICONDUCTOR DEVICE AND METHOD FOR MANUFACTURING THE SAME

(71) Applicant: ROHM CO., LTD., Kyoto (JP)

(72) Inventor: Koshun Saito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/853,252

(22) Filed: Apr. 20, 2020

(65) Prior Publication Data

US 2020/0251433 A1 Aug. 6, 2020

Related U.S. Application Data

(63) Continuation of application No. 16/509,159, filed on Jul. 11, 2019, now Pat. No. 10,658,317, which is a (Continued)

(30) Foreign Application Priority Data

May 2, 2016 (JP) .................................. 2016-092338
Jun. 27, 2016 (JP) .................................. 2016-126447

(51) Int. Cl.
*H01L 23/00* (2006.01)
*H01L 21/768* (2006.01)
(Continued)

(52) U.S. Cl.
CPC ........ *H01L 24/05* (2013.01); *H01L 21/76867* (2013.01); *H01L 23/3107* (2013.01); *H01L 23/4952* (2013.01); *H01L 23/49548* (2013.01); *H01L 23/49562* (2013.01); *H01L 23/49582* (2013.01); *H01L 24/29* (2013.01);
(Continued)

(58) Field of Classification Search
CPC ............ H01L 23/3107; H01L 23/4952; H01L 23/49548; H01L 23/49562; H01L 23/49582; H01L 23/562
See application file for complete search history.

(56) References Cited

U.S. PATENT DOCUMENTS 3,988,518 A 10/1976 McGrath
6,201,292 B1 3/2001 Yagi et al.
(Continued)

FOREIGN PATENT DOCUMENTS

JP 6-302740 A 10/1994
JP 2005-209770 A 8/2005
(Continued)

OTHER PUBLICATIONS

Office Action received in the corresponding Japanese Patent application, dated Mar. 24, 2020, and corresponding English machine translation (25 pages).

*Primary Examiner* — Peniel M Gumedzoe
(74) *Attorney, Agent, or Firm* — Hamre, Schumann, Mueller & Larson, P.C.

(57) ABSTRACT

A semiconductor device includes a predetermined number of leads, a semiconductor element electrically connected to the leads and supported by one of the leads, and a sealing resin that covers the semiconductor element and a part of each lead. Each lead includes some portions exposed from the sealing resin. A surface plating layer is formed on at least one of the exposed portions of the respective leads.

18 Claims, 19 Drawing Sheets

Related U.S. Application Data continuation of application No. 15/496,800, filed on Apr. 25, 2017, now Pat. No. 10,388,616.

(51) Int. Cl.
*H01L 23/31* (2006.01)
*H01L 23/495* (2006.01)

(52) U.S. Cl.
CPC ............ H01L 24/46 (2013.01); H01L 24/49 (2013.01); H01L 24/97 (2013.01); *H01L 23/562* (2013.01); *H01L 2224/04042* (2013.01); *H01L 2224/05553* (2013.01); *H01L 2224/05554* (2013.01); *H01L 2224/0603* (2013.01); *H01L 2224/29644* (2013.01); *H01L 2224/32245* (2013.01); *H01L 2224/48247* (2013.01); *H01L 2224/48465* (2013.01); *H01L 2224/49111* (2013.01); *H01L 2224/49113* (2013.01); *H01L 2224/49431* (2013.01); *H01L 2224/73265* (2013.01); *H01L 2224/97* (2013.01); *H01L 2924/00014* (2013.01); *H01L 2924/15747* (2013.01); *H01L 2924/181* (2013.01)

(56) References Cited

U.S. PATENT DOCUMENTS

| | | | |
|---|---|---|---|
| 6,489,218 B1 | 12/2002 | Kim et al. | |
| 6,756,658 B1 * | 6/2004 | Gillett | H01L 23/49562 257/666 |
| 6,879,034 B1 | 4/2005 | Yang et al. | |
| 2005/0139982 A1 | 6/2005 | Fukaya et al. | |
| 2005/0156204 A1 * | 7/2005 | Uno | H01L 24/37 257/213 |
| 2005/0287709 A1 | 12/2005 | Lee et al. | |
| 2006/0022298 A1 * | 2/2006 | Shiraishi | H01L 23/3107 257/509 |
| 2006/0138615 A1 | 6/2006 | Sato et al. | |
| 2009/0065915 A1 | 3/2009 | Lehmann | |
| 2012/0248591 A1 | 10/2012 | Kure et al. | |
| 2013/0009300 A1 * | 1/2013 | Yato | H01L 24/92 257/676 |
| 2014/0210064 A1 | 7/2014 | Lopez et al. | |
| 2014/0306328 A1 * | 10/2014 | Mikado | H01L 23/3107 257/666 |
| 2015/0001698 A1 | 1/2015 | Jaurigue et al. | |
| 2015/0014829 A1 | 1/2015 | Abbott | |
| 2015/0076675 A1 | 3/2015 | Real et al. | |
| 2015/0076690 A1 | 3/2015 | Yoshino | |
| 2015/0380384 A1 | 12/2015 | Williams et al. | |
| 2016/0181493 A1 | 6/2016 | Miki | |
| 2016/0254214 A1 | 9/2016 | Makino | |

FOREIGN PATENT DOCUMENTS

| | | |
|---|---|---|
| JP | 2009-49435 A | 3/2009 |
| JP | 2009-71033 A | 4/2009 |
| JP | 2014-72236 A | 4/2014 |
| JP | 2015-233132 A | 12/2015 |

\* cited by examiner

SEMICONDUCTOR DEVICE AND METHOD FOR MANUFACTURING THE SAME

FIELD

The present disclosure relates to a semiconductor device and a method for manufacturing a semiconductor device.

BACKGROUND

Conventional semiconductor devices incorporating semiconductor elements such as transistors are available on the market in various configurations. For example, a semiconductor device may include a semiconductor element, a plurality of leads and a sealing resin. The incorporated semiconductor element is mounted on one of the leads and electrically connected to all the leads. The sealing resin covers the semiconductor element and a part of each lead. The exposed portions of the respective leads provide terminals to be bonded to e.g., a printed circuit board by soldering for example.

Depending on the specifications and/or usage environment of the semiconductor device, a certain degree of stress may occur in the solder applied between the terminals and the circuit board. Unfavorably such stress may cause the solder to crack or even come off the bonding location.

SUMMARY

The present disclosure has been proposed under the above circumstances, and an object thereof is to provide a semiconductor device that is attachable to e.g., a printed circuit board with greater mounting strength than is conventionally possible.

According to an aspect of the present disclosure, there is provided a semiconductor device provided with at least one lead, a semiconductor element, and a sealing resin. The lead includes an obverse surface and a reverse surface that are spaced apart from each other in a thickness direction of the device. The semiconductor element, such as a transistor for example, is electrically connected to the lead. The sealing resin covers the semiconductor element and a part of the lead. The lead includes portions exposed from the sealing resin, and at least one of the exposed portions is formed with a surface plating layer.

According to another aspect of the present disclosure, there is provided a method for making a semiconductor device of the above-noted aspect of the disclosure. In accordance with the method, the following steps may be performed. A lead frame is prepared, which includes an obverse surface and a reverse surface that are spaced apart from each other in a thickness direction of the semiconductor device. A semiconductor element is mounted on the obverse surface of the lead frame. A sealing resin is formed to cover the semiconductor element and a part of the lead frame. By substitutional electroless plating, a surface plating layer is formed at least on a part of exposed portions of the lead frame that are exposed from the sealing resin.

Other features and advantages of the present disclosure will become apparent from the detailed description given below with reference to the accompanying drawings.

DESCRIPTION OF EMBODIMENTS

Figure 1:
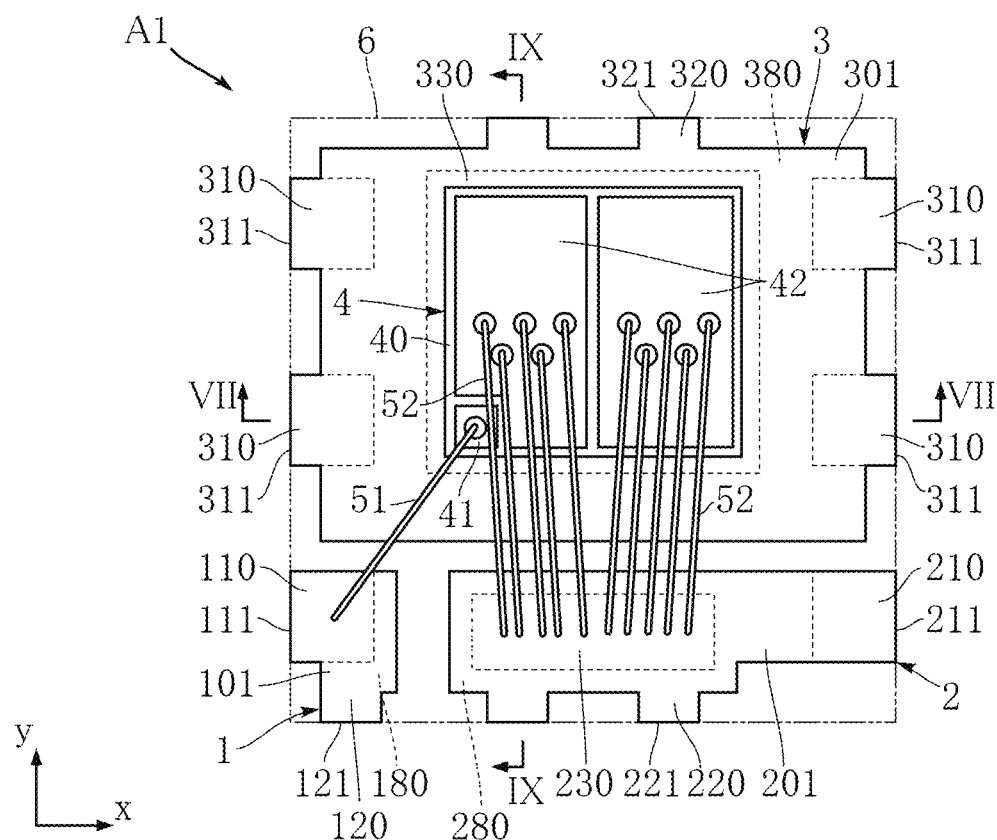
FIG. 1 is a plan view showing a semiconductor device according to a first embodiment of the present disclosure.
Figure 2:
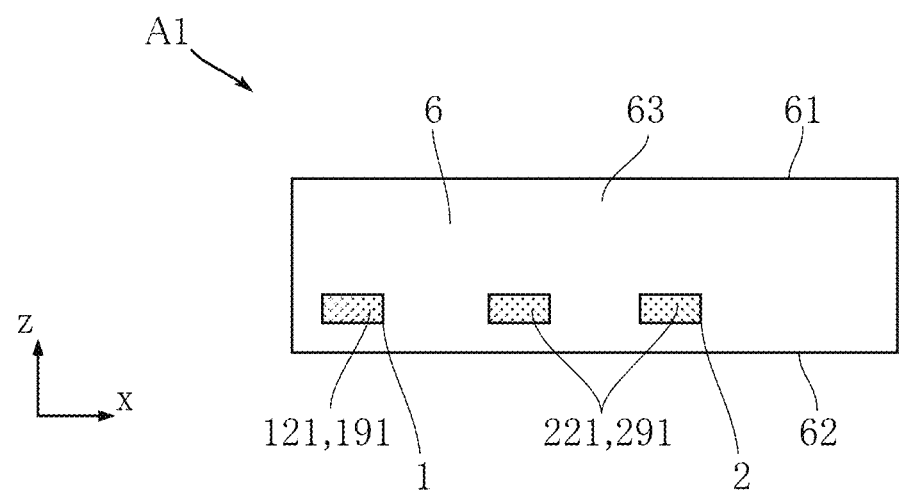
FIG. 2 is a front view showing the semiconductor device according to the first embodiment of the present disclosure.
Figure 3:
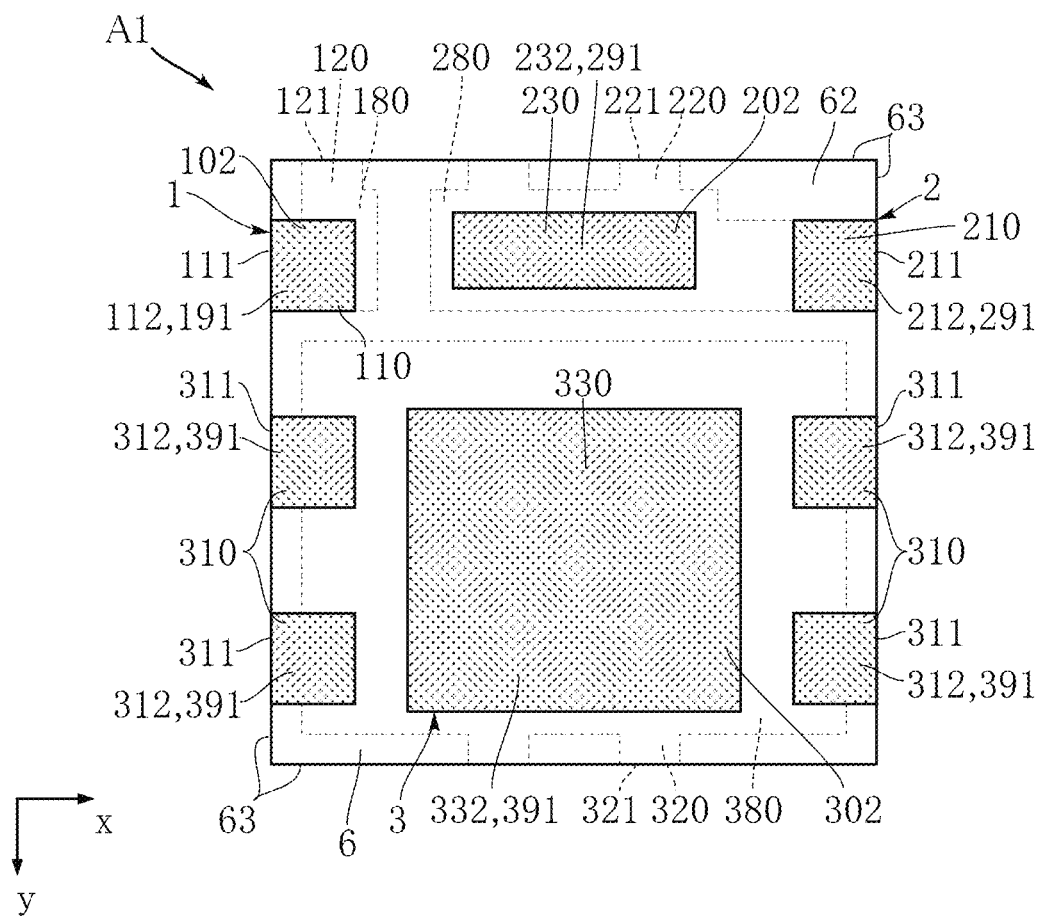
FIG. 3 is a bottom view showing the semiconductor device according to the first embodiment of the present disclosure.
Figure 4:
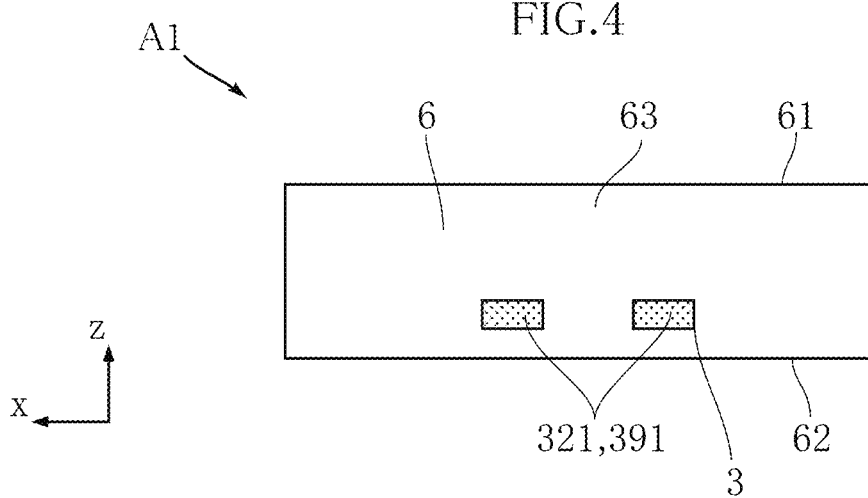
FIG. 4 is a rear view showing the semiconductor device according to the first embodiment of the present disclosure.
Figure 5:
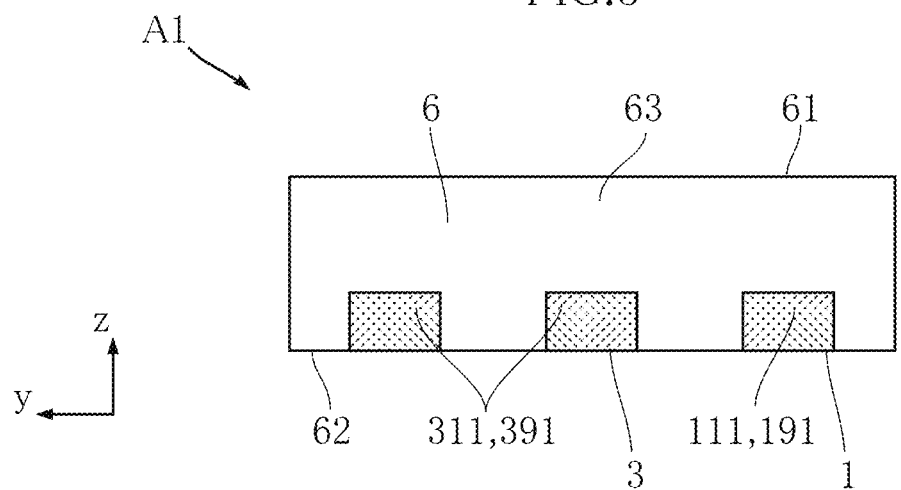
FIG. 5 is a left-side view showing the semiconductor device according to the first embodiment of the present disclosure.
Figure 6:
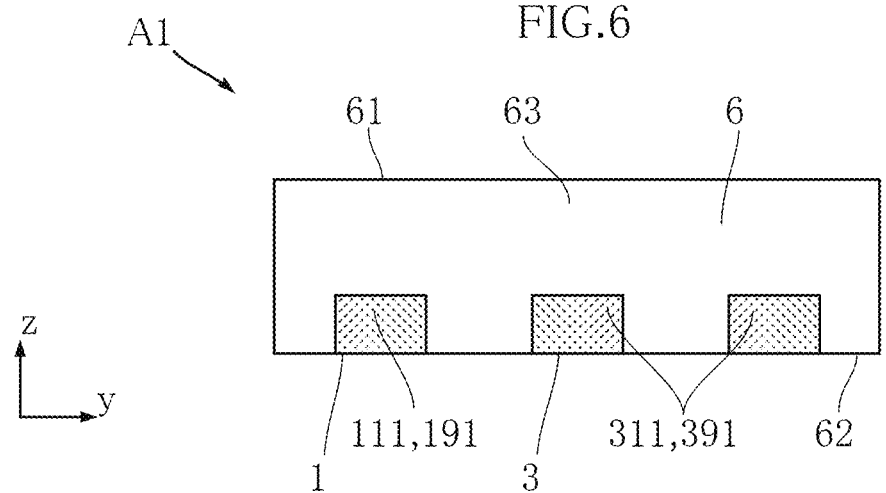
FIG. 6 is a right-side view showing the semiconductor device according to the first embodiment of the present disclosure.
Figure 7:
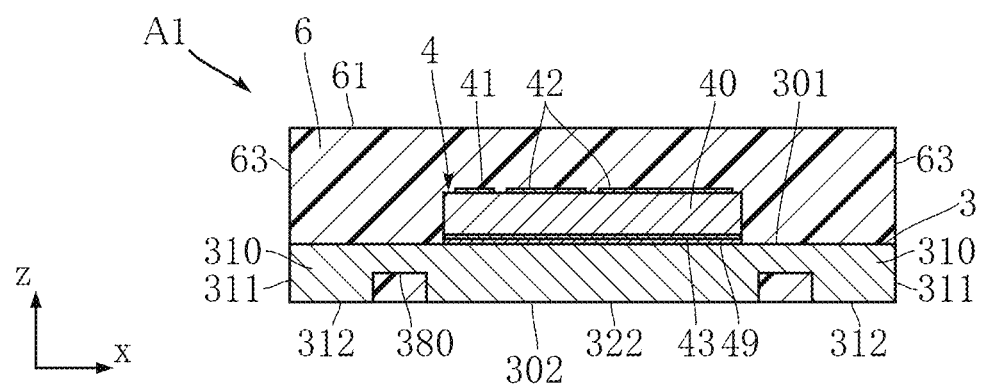
FIG. 7 is a cross-sectional view taken along line VII-VII in FIG. 1.

Embodiments of the present disclosure will now be described with reference to the accompanying drawings.

FIGS. 1 through 9 show a semiconductor device according to a first embodiment of the present disclosure. The illustrated semiconductor device A1 includes three sorts of leads 1-3, a semiconductor element 4, and a sealing resin 6. In FIGS. 2 to 6, the dotted areas indicate plating layers 191, 291, 391 to be described below.

The semiconductor device A1 is not particularly limited in size. In this embodiment, the semiconductor device A1 may have dimensions of 1.8 mm to 2.6 mm in the x direction, 1.8 mm to 2.6 mm in the y direction, and 0.7 mm to 1.0 mm in the z direction.

The leads 1, 2, and 3 are electrically connected to the semiconductor element 4. Hereinafter, the leads 1, 2, and 3 are respectively referred to as a first wire-bonding lead 1, a second wire-bonding lead 2, and a primary lead 3. The first wire-bonding lead or first lead 1, the second wire-bonding lead or second lead 2, and the primary lead 3 may be formed by punching or bending a metal plate, for example. The first lead 1, the second lead 2, and the primary lead 3 are made of metal, preferably Cu, Ni, an alloy of these metals, or Alloy 42, for example. In the present embodiment, the three leads 1, 2 and 3 are made of Cu. The leads 1-3 may have a thickness of 0.08 mm to 0.3 mm for example, and in the present embodiment each lead has a thickness of about 0.125 mm.

As shown in FIG. 1, the first lead 1 and the second lead 2 are aligned in the x direction. The primary lead 3 is spaced apart from the first lead 1 and the second lead 2 in the y direction. As viewed in the z direction (in other words, in the thickness direction or in plan view), the primary lead 3 is the greatest in size among all the three leads, and the first lead 1 is the smallest.

The first lead 1 has an obverse surface 101, a reverse surface 102, and a reverse-side recess 180. The obverse surface 101 and the reverse surface 102 are spaced apart and face away from each other in the z direction. The reverse-side recess 180 is a portion of the first lead 1 which is recessed upward from the reverse surface 102 in the z direction. The first lead 1 has a terminal portion 110 and a connecting portion 120.

As viewed in the z direction, the terminal portion 110 is provided at a position avoiding the reverse-side recess 180 and has a rectangular shape. The terminal portion 110 has a terminal end face 111 and a terminal reverse surface 112. The terminal end face 111 faces in the x direction and is exposed from the sealing resin 6. The terminal reverse surface 112 is apart of the reverse surface 102 of the lead 1, and is exposed from the sealing resin 6.

The connecting portion 120 is included in a range of the reverse-side recess 180 as viewed in the z direction. In other words, the entirety of the connecting portion 120 overlaps with the reverse-side recess 180 as viewed in the z direction. The connecting portion 120 has a connecting end face 121. The connecting end face 121 faces in the y direction and is exposed from the sealing resin 6.

A first plating layer 191 is formed on the first lead 1 except for the parts covered with the sealing resin 6. Specifically, the first plating layer is formed on all parts of the first lead 1 that are exposed from the sealing resin 6. Thus, in the present embodiment, the first plating layer 191 is formed on the terminal end face 111 and the terminal reverse surface 112 of the terminal portion 110 and on the connecting end face 121 of the connecting portion 120. The first plating layer 191 is made of a material having a higher solder wettability than the first lead 1, and more specifically, than the base material of the lead 1. Here, the base material of a lead may refer to the main ingredient of the material forming the lead. When the lead is made of only a single substance or element (Cu, for example), this single substance is the base material. In the present embodiment, the first plating layer 191 may be made of Au. The first plating layer 191 may be formed by substitutional electroless plating, which is performed in a manufacturing method described below.

The second lead 2 has an obverse surface 201, a reverse surface 202, and a reverse-side recess 280. The obverse surface 201 and the reverse surface 202 are spaced part and face away from each other in the z direction. The reverse-side recess 280 is a portion of the second lead 2 which is recessed upward from the reverse surface 202 in the z direction. The second lead 2 has a terminal portion 210, connecting portions 220, and a wire-bonding portion 230.

As viewed in the z direction, the terminal portion 210 is provided at a position avoiding the reverse-side recess 280 and has a rectangular shape. The terminal portion 210 has a terminal end face 211 and a terminal reverse surface 212. The terminal end face 211 faces in the x direction and is exposed from the sealing resin 6. The terminal reverse surface 212 is apart of the reverse surface 202 of the lead 2, and is exposed from the sealing resin 6.

The connecting portions 220 are included in a range of the reverse-side recess 280 as viewed in the z direction. Each connecting portion 220 has a connecting end face 221. The connecting end face 221 faces in the y direction and is exposed from the sealing resin 6.

As viewed in the z direction, the wire-bonding portion 230 of the lead 2 is surrounded by the reverse-side recess 280 and has a rectangular shape. The wire-bonding portion 230 has a reverse surface 232, which is a part of the reverse surface 202 of the lead 2 and is exposed from the sealing resin 6.

The second plating layer 291 is formed on the second lead 2 except for the parts covered with the sealing resin 6, in other words, on all parts of the second lead 2 that are exposed from the sealing resin 6. Thus, in the present embodiment, the second plating layer 291 is formed on the terminal end face 211 and the terminal reverse surface 212 of the terminal portion 210, the connecting end faces 221 of the connecting portions 220, and the reverse surface 232 of the wire-bonding portion 230. The second plating layer 291 is made of a material having a higher solder wettability than the second lead 2, and more specifically, than the base material of the lead 2. In the present embodiment, the second plating layer 291 may be made of Au. The second plating layer 291 is formed by substitutional electroless plating, which is performed in a manufacturing method described below.

The primary lead 3 has an obverse surface 301, a reverse surface 302, and a reverse-side recess 380. The obverse surface 301 and the reverse surface 302 are spaced apart and face away from each other in the z direction. The reverse-side recess 380 is a portion of the primary lead 3 which is recessed upward in the z direction from the reverse surface 302. The primary lead 3 has terminal portions 310, connecting portions 320, and an element bonding portion 330.

As viewed in the z direction, each of the terminal portions 310 is provided at a position avoiding the reverse-side recess 380 and has a rectangular shape. Each of the terminal portions 310 has a terminal end face 311 and a terminal reverse surface 312. The terminal end face 311 faces in the x direction and is exposed from the sealing resin 6. The terminal reverse surface 312 is a part of the reverse surface 302, and is exposed from the sealing resin 6.

The connecting portions 320 are included in a range of the reverse-side recess 380 as viewed in the z direction. Each of the connecting portions 320 has a connecting end face 321. The connecting end face 321 faces in the y direction and is exposed from the sealing resin 6.

As viewed in the z direction, the element bonding portion 330 is surrounded by the reverse-side recess 380 and has a rectangular shape. The element bonding portion 330 has an element-bonding reverse surface 332, which is a part of the reverse surface 302 and is exposed from the sealing resin 6.

The third plating layer 391 is formed on the primary lead 3 except for the parts covered with the sealing resin 6, or in other words, on all parts of the primary lead 3 exposed from the sealing resin 6. In the present embodiment, the third plating layer 391 is formed on the terminal end faces 311 and terminal reverse surfaces 312 of the terminal portions 310, the third connecting end portions 321 of the connecting portions 320, and the element-bonding reverse surface 332 of the element bonding portion 330. The third plating layer 391 is made of a material having a higher solder wettability than the primary lead 3, and more specifically, than the base material of the lead 3. In the present embodiment, the third plating layer 391 is made of Au, for example. The third plating layer 391 is formed by substitutional electroless plating, which is performed in a manufacturing method described below.

The semiconductor element 4 is chosen to fulfill the electric functions required for the semiconductor device A1. The type of the semiconductor element 4 is not particularly limited. In the present embodiment, the semiconductor element 4 may be a transistor and mounted on the primary lead 3. The semiconductor element 4 includes an element body 40, a first electrode 41, second electrodes 42, and a third electrode 43 opposite to the first and the second electrodes.

The first electrode 41 and the second electrodes 42 are arranged on the upper surface of the element body 40 that faces the same side as the obverse surface 301 of the primary lead 3. The third electrode 43 (FIG. 7) is arranged on the lower surface of the element body 40 that faces the same side as the reverse surface 302. In the present embodiment, the first electrode 41 is a gate electrode, the second electrodes 42 are source electrodes, and the third electrode 43 is a drain electrode.

The semiconductor device A1 has a first wire 51 and second wires 52. The first wire 51 is connected to the first electrode 41 and the terminal portion 110 of the first lead 1. Each second wire 52 is connected to one of the second electrodes 42 and the wire-bonding portion 230 of the second lead 2.

The third electrode 43 is connected to the element bonding portion 330 of the primary lead 3 via a conductive bonding member or layer 49. The conductive bonding member 49 bonds the third electrode 43 to the obverse surface 301 of the element bonding portion 330.

The sealing resin 6 covers parts of the first, second and primary leads 1-3, the semiconductor element 4, the first wire 51, and the second wires 52. The sealing resin 6 may be formed by a black epoxy resin.

The sealing resin 6 has an obverse surface 61, a reverse surface 62 and four side surfaces 63 (or a single side surface 63 when the four flat surfaces are considered as a continuous one surface). The obverse surface 61 and the reverse surface 62 are spaced apart and face away from each other in the z direction. The obverse surface 61 faces the same side as the obverse surface 101 of the first lead 1, and hence as the obverse surface 201 of the second lead 2, and the obverse surface 301 of the primary lead 3. The reverse surface 62 faces the same side as the reverse surface 102 of the first lead 1, and hence as the reverse surface 202 of the lead 2, and the reverse surface 302 of the primary lead 3. Each of the sealing-resin side surfaces 63 is connected to the obverse surface 61 and the reverse surface 62, and faces either in the x direction or the y direction.

In the present embodiment, the terminal end face 111 and the connecting end face 121 of the first lead 1 are flush with the sealing-resin side surface 63 of the sealing resin 6. Likewise, the terminal end face 211 and the connecting end faces 221 of the second lead 2, and the terminal end faces 311 and the connecting end faces 321 of the primary lead 3 are flush with the sealing-resin side surface 63 of the sealing resin 6. Further, the terminal reverse surface 112 of the first lead 1, the terminal reverse surface 212 and the reverse surface 232 of the second lead 2, and the terminal reverse surfaces 312 and the element-bonding reverse surface 332 of the primary lead 3 are flush with the reverse surface 62 of the sealing resin 6.

Figure 10:
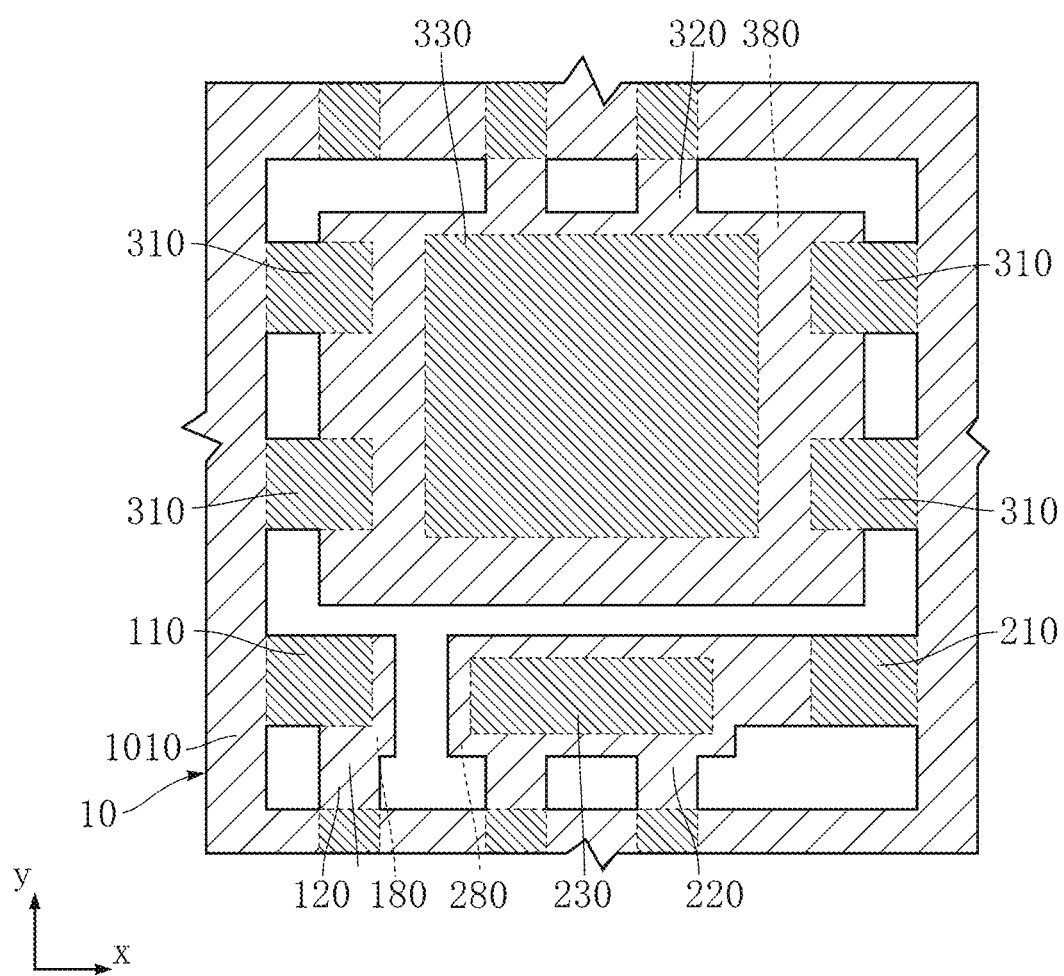
FIG. 10 is a plan view showing a method for manufacturing the semiconductor device according to the first embodiment of the present disclosure.
Figure 11:
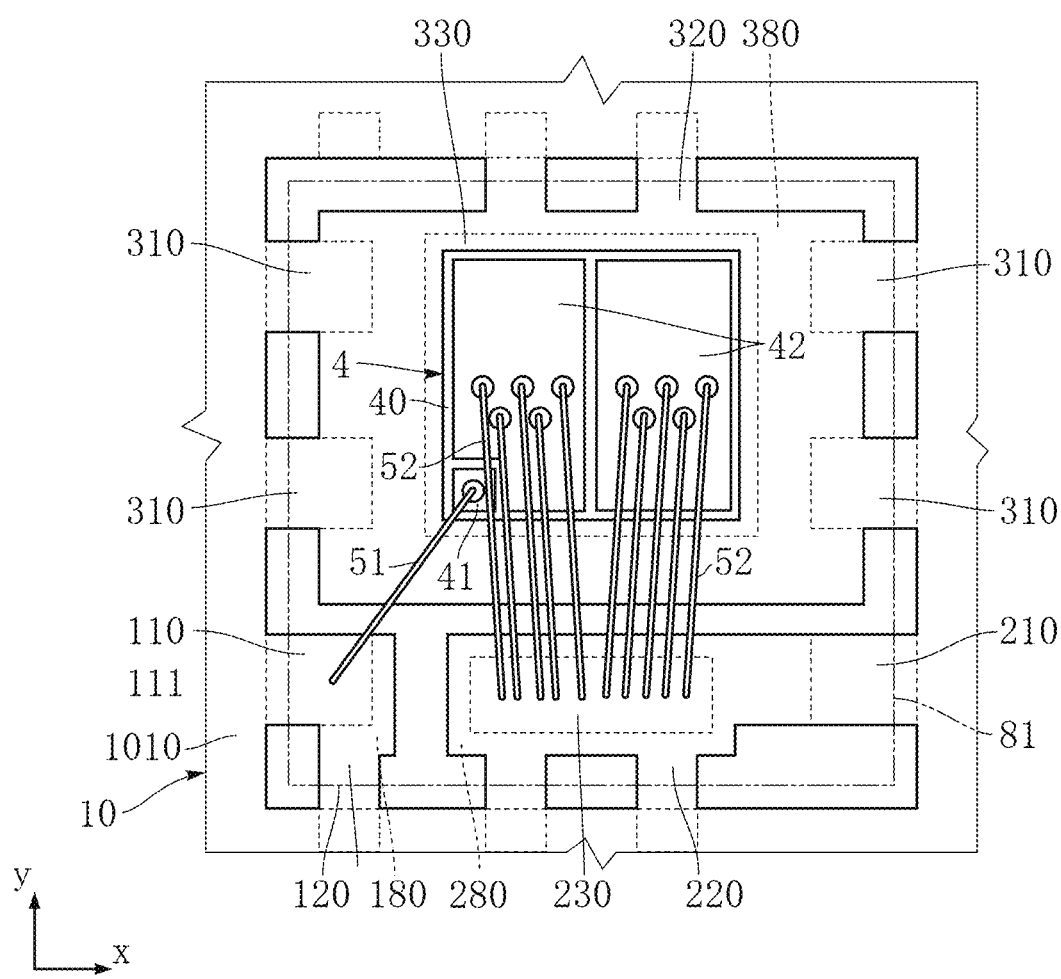
FIG. 11 is a plan view showing the method for manufacturing the semiconductor device according to the first embodiment of the present disclosure.
Figure 12:
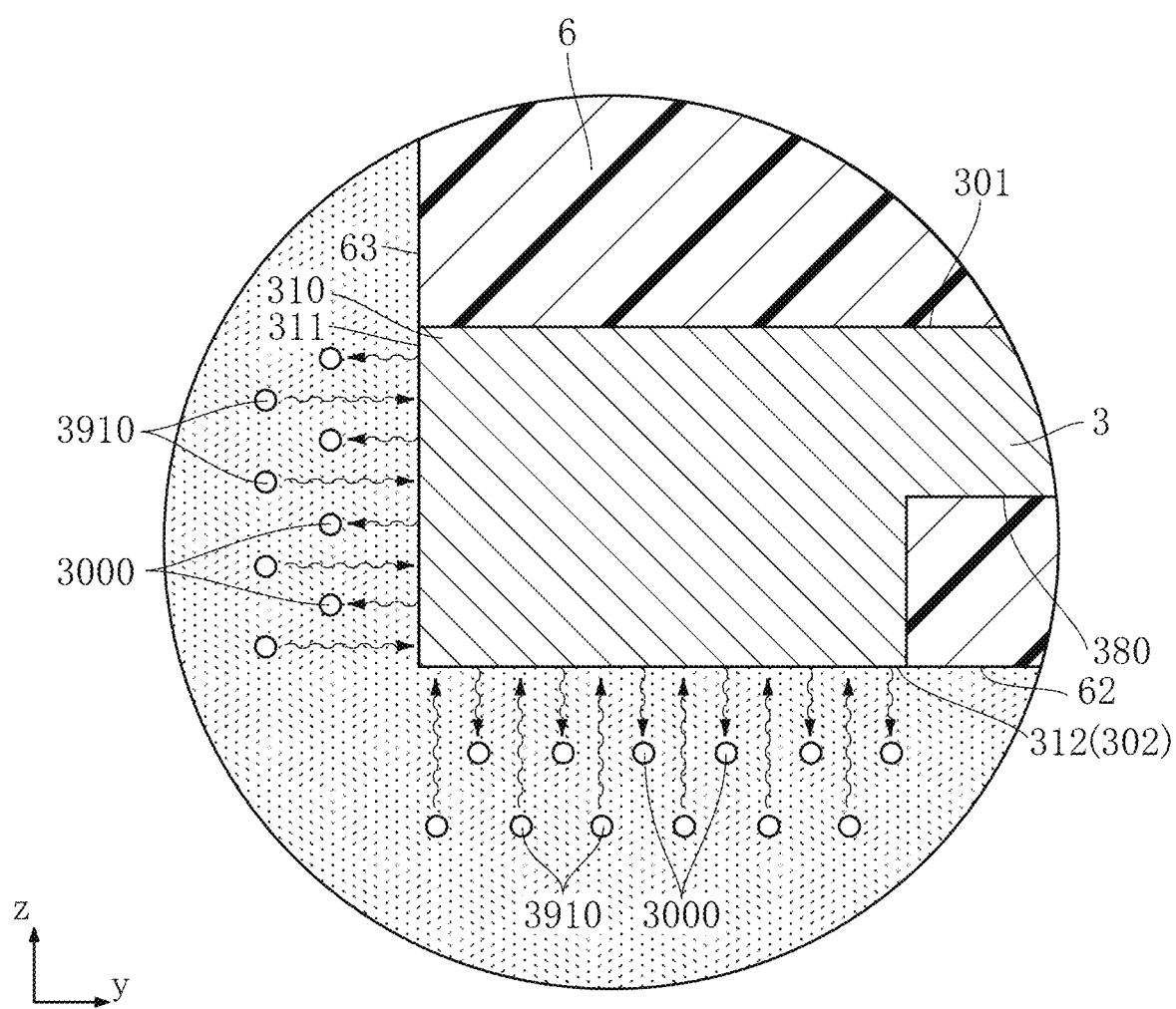
FIG. 12 is a partially enlarged cross-sectional view showing the method for manufacturing the semiconductor device according to the first embodiment of the present disclosure.

The following describes a method for manufacturing the semiconductor device A1, with reference to FIGS. 10 to 12.

First, a lead frame 10 is prepared as shown in FIG. 10. The lead frame 10 is a plate-like material that forms the first lead 1, the second lead 2, and the primary lead 3. An obverse surface 1010 of the lead frame 10 provides the obverse surface 101, the obverse surface 201, and the obverse surface 301. In FIG. 10, the sparsely hatched parts provide the reverse-side recess 180, the reverse-side recess 280, and the reverse-side recess 380. Further, the densely hatched parts provide the terminal portion 110, the terminal portion 210, the wire-bonding portion 230, the terminal portions 310, and the element bonding portion 330. In the present embodiment, the base material of the lead frame 10 is Cu.

Next, as shown in FIG. 11, a semiconductor element 4 is bonded to the element bonding portion 330 of the lead frame 10 with a conductive bonding member 49. Also, a first wire 51 is bonded to the first electrode 41 and the terminal portion 110, and second wires 52 are bonded to the second electrodes 42 and the wire-bonding portion 230. Next, a sealing material, which is not shown in the figure, is cured to form the sealing resin 6 (not shown) that covers a part of the lead frame 10, as well as the semiconductor element 4, the first wire 51, and the second wires 52. In the present embodiment, the sealing resin 6 is formed on the entire region shown in FIG. 11. Next, the lead frame 10 and the sealing resin 6 are cut along a cut line 81. In this way, a piece corresponding to the semiconductor device A1 is obtained.

Next, the first plating layer 191, the second plating layer 291, and the third plating layer 391 are formed on the piece obtained by the cutting. In the present embodiment, the obtained piece is subjected to substitutional electroless plating whereby the piece is immersed in a predetermined plating solution. As a result, as seen from the illustration of FIG. 12 (featuring the primary lead 3 only for the purpose of an example), Cu (the base material of the primary lead 3) becomes Cu ions ("lead base-material ions 3000") and escape from the terminal end face 311 and the terminal reverse surface 312, which are exposed from the sealing resin 6. In turn, Au ions ("surface plating ions 3910) included in the plating solution take place of the lead base-material ions 3000 to be bound to the terminal end face 311 and the terminal reverse surface 312. The substitution between the lead base-material ions 3000 and the surface plating ions 3910 causes a third plating layer 391 to form on the terminal end face 311 and the terminal reverse surface 312. In substitutional electroless plating, the substitution at a given portion will end when the lead base-material ions 3000 at the portion have been substituted by the surface plating ions 3910. As such, the third plating layer 391 formed by substitutional electroless plating does not have a significant thickness that that would otherwise cause the surface of the primary lead 3 to unduly protrude. Accordingly, even after the formation of the third plating layer 391, the terminal end face 311 remains flush with the sealing-resin side surface 63, and the terminal reverse surface 312 remains flush with the reverse surface 62.

In addition to the third plating layer 391, the first plating layer 191 and the second plating layer 291 are also formed. Similarly to the above, the first plating layer 191 and the second plating layer 291 do not have significant thicknesses that would cause the surfaces of the first lead 1 and the second lead 2 to protrude. Accordingly, even after the first plating layer 191 and the second plating layer 291 are formed, the terminal end face 111, the connecting end face 121, the terminal end face 211, and the connecting end faces 221 remain flush with the sealing-resin side surfaces 63, and, the terminal reverse surface 112, the terminal reverse surface 212, and the reverse surface 232 remain flush with the reverse surface 62.

These steps as described above are performed to form the semiconductor device A1.

The following describes advantages of the semiconductor device A1 and the method for manufacturing the device A1.

According to the present embodiment, the first plating layer 191, the second plating layer 291, and the third plating layer 391 are formed on all the exposed parts of the relevant leads 1, 2 and 3. Each plating layer 191, 291 and 391 is made of a material having a higher solder wettability than the base material of the relevant lead 1, 2 and 3. Accordingly, when the semiconductor device A1 is to be mounted on e.g., a circuit board by solder, the solder can be adhered to all the exposed parts of the leads 1-3, and this contributes to enhancing the bonding or mounting strength of the semiconductor device A1 to the circuit board.

The first plating layer 191, the second plating layer 291, and the third plating layer 391 are formed by substitutional electroless plating; therefore, in the piece divided out from the lead frame 10 shown in FIG. 11, the first plating layer 191, the second plating layer 291, and the third plating layer 391 are reliably formed on all parts of the first lead 1, the second lead 2, and the primary lead 3 that are exposed from the sealing resin 6. This is preferable in enhancing the mounting strength. Also, since substitutional electroless plating is employed, the first lead 1, the second lead 2, and the primary lead 3 do not need to have a shape electrically connectable to a plating electrode for electrolytic plating. Furthermore, the first plating layer 191, the second plating layer 291, and the third plating layer 391 are not formed on the parts of the first lead 1, the second lead 2, and the primary lead 3 that are covered with the sealing resin 6. This is preferable in reducing the manufacturing cost of the semiconductor device A1.

The terminal end face 111, the connecting end face 121, the terminal end face 211, the connecting end faces 221, the terminal end faces 311, and the connecting end faces 321 are flush with the sealing-resin side surfaces 63. As such, the first lead 1, the second lead 2, and the primary lead 3 do not protrude from the sealing resin 6 as viewed in the z direction. This makes it possible to enhance the mounting strength of the semiconductor device while reducing the area necessary for mounting the semiconductor device A1.

Figure 8:
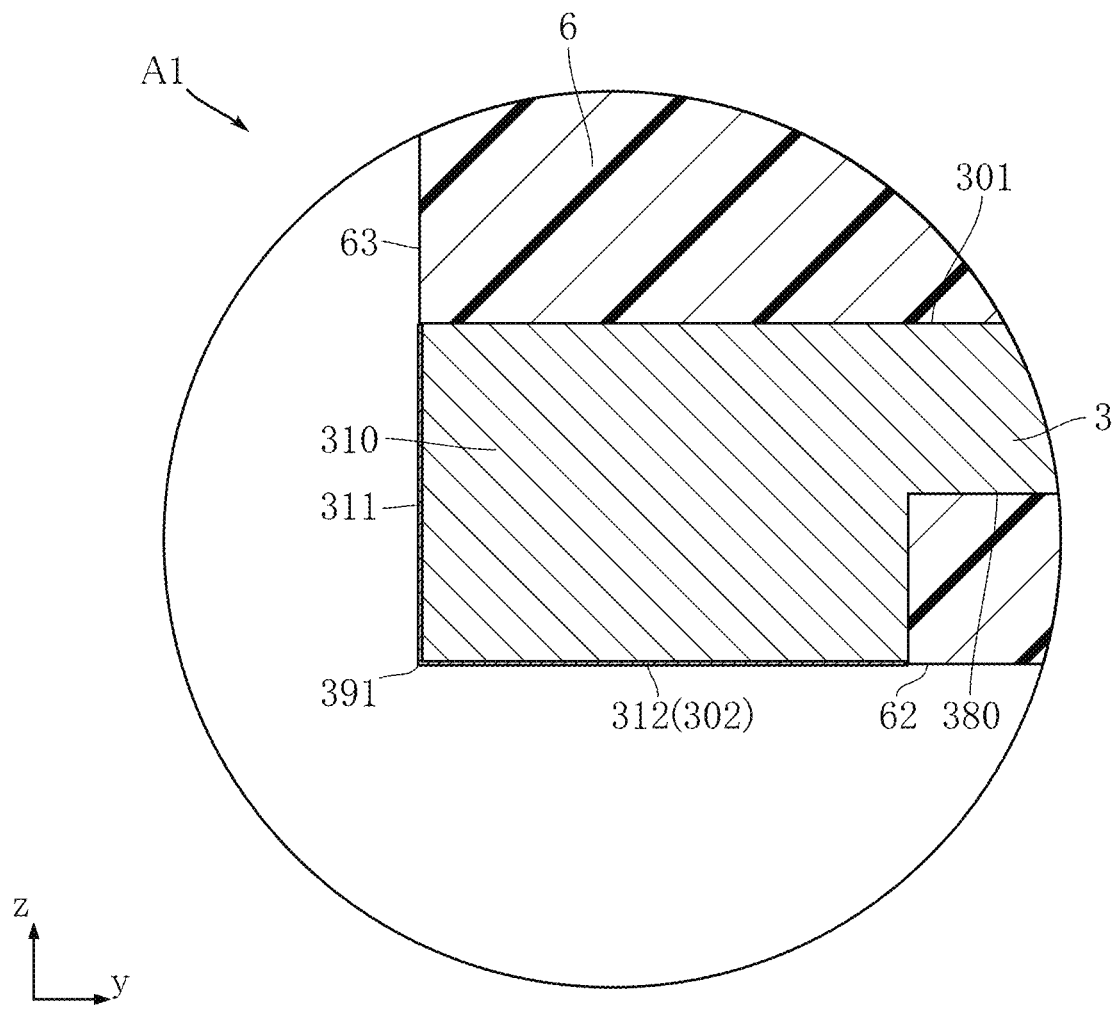
FIG. 8 is a partially enlarged cross-sectional view taken along line VII-VII in FIG. 1.
Figure 9:
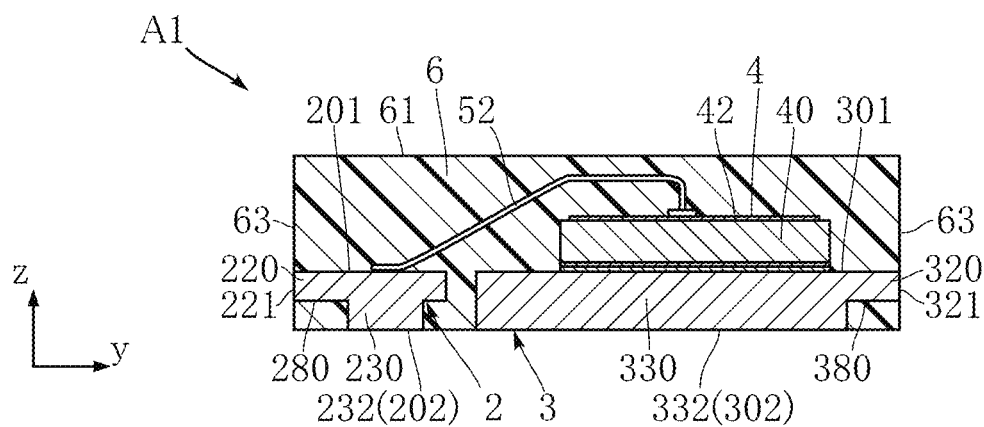
FIG. 9 is a cross-sectional view taken along line IX-IX in FIG. 1.

The terminal reverse surface 112, the terminal reverse surface 212, and the terminal reverse surfaces 312 are flush with the reverse surface 62, and are provided with the first plating layer 191, the second plating layer 291, and the third plating layer 391, respectively. In this way, the third plating layer 391 is formed on the terminal end faces 311 and the terminal reverse surfaces 312, as shown in FIG. 8. This is suitable in reliably adhering solder in a continuous manner from the terminal end faces 311 to the terminal reverse surfaces 312 when mounting the semiconductor device A1.

FIGS. 13 to 33 show other embodiments of the present disclosure. In these figures, elements that are the same as or similar to those in the above embodiments are indicated by the same reference signs as in the above embodiment.

Figure 13:
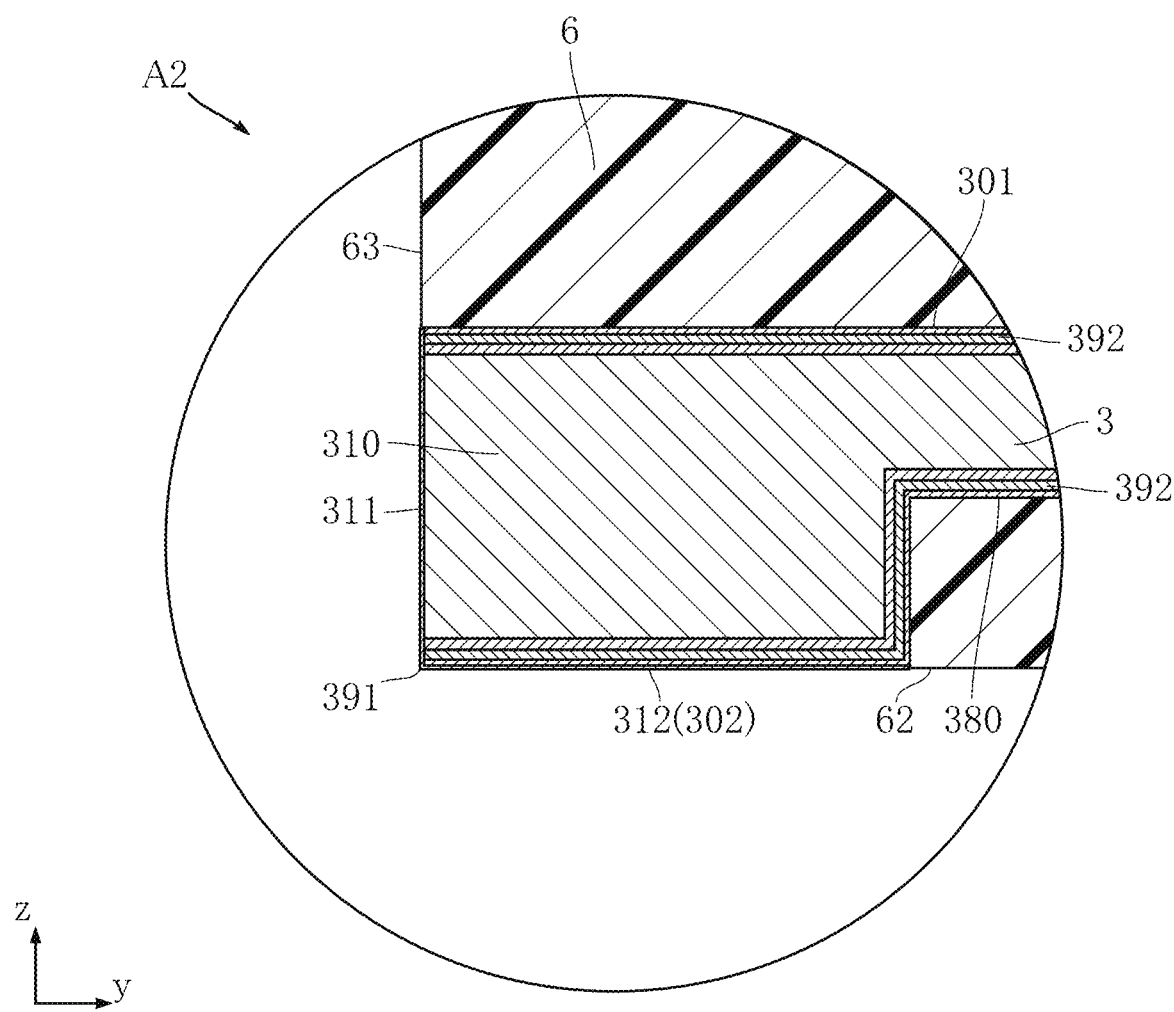
FIG. 13 is a partially enlarged cross-sectional view showing a semiconductor device according to a second embodiment of the present disclosure.

FIG. 13 shows a semiconductor device according to a second embodiment of the present disclosure. Regarding a semiconductor device A2 of the present embodiment, an intermediate plating layer 392 is formed on the primary lead 3.

The intermediate plating layer 392 is formed on the obverse surface 301, the reverse surface 302, and the reverse-side recess 380. On the other hand, the intermediate plating layer 392 is not formed on the terminal end faces 311 and the connecting end faces 321. This is because the intermediate plating layer 392 is formed on the upper and lower surfaces of the lead frame 10 shown in FIG. 10, and as such, the terminal end faces 311 and the connecting end faces 321, which are formed by cutting the lead frame 10, are not provided with the intermediate plating layer 392.

The intermediate plating layer 392 may be a laminate made up of a Ni plating layer, a Pd plating layer, and a Au plating layer. The Ni plating layer may have a thickness of 0.5 µm to 2.0 µm, the Pd plating layer a thickness of 0.02 µm to 0.15 µm, and the Au plating layer a thickness of 0.003 µm to 0.015 µm. Other examples of the intermediate plating layer 392 include a laminate made up of a Ni plating layer and a Au plating layer.

The intermediate plating layer 392 is provided between the terminal reverse surface 312 and the third plating layer 391. In this fashion, the Au layer of the intermediate plating layer 392 is assimilated into the third plating layer 391.

The above embodiment also serves to enhance the mounting strength of the semiconductor device A2.

Figure 14:
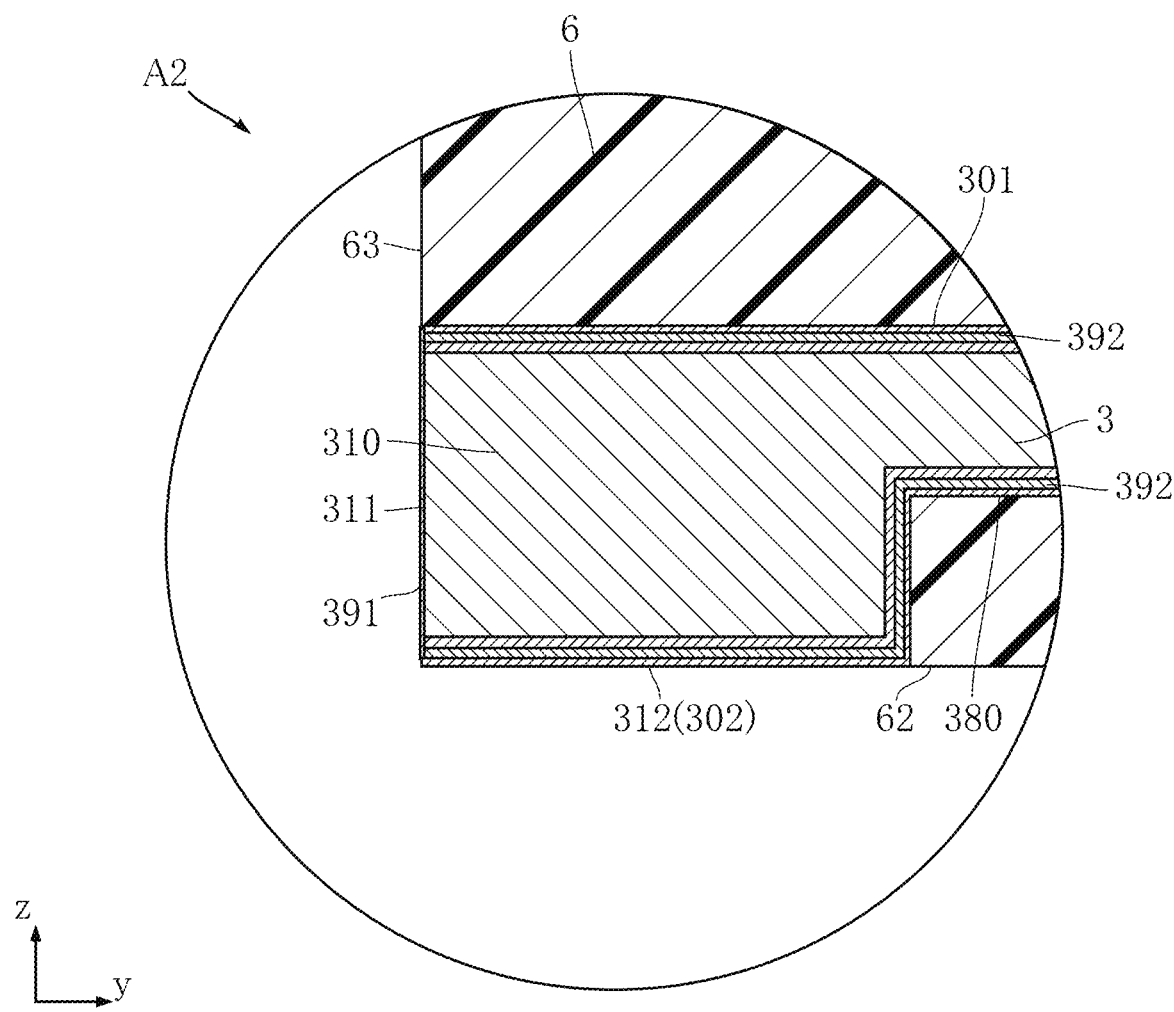
FIG. 14 is a partially enlarged cross-sectional view showing a variation of the semiconductor device according to the second embodiment of the present disclosure.

FIG. 14 shows a variation of the semiconductor device A2. In the present variation, the first plating layer 191, the second plating layer 291 and the third plating layer 391 are provided at different places or regions than those in the above-noted example.

As shown in the example of FIG. 14, the third plating layer 391 of the primary lead 3 does not cover the intermediate plating layer 392 on the terminal reverse surface 312. The third plating layer 391 is formed on the terminal end face 311 where the base material of the primary lead 3 is exposed. The same holds for the first plating layer 191 and the second plating layer 291, which cover the terminal end face 111 and the terminal end face 211 but do not cover the terminal reverse surface 112 or the terminal reverse surface 212. Such a variation can also enhance the mounting strength of the semiconductor device A2.

FIGS. 15 to 21 show a semiconductor device according to a third embodiment of the present disclosure. A semiconductor device A3 of the present disclosure differs from the semiconductor devices A1 and A2 in that the first plating layer 191, the second plating layer 291 and the third plating layer 391 are formed at different places or regions than those of the above-noted example.

Figure 15:
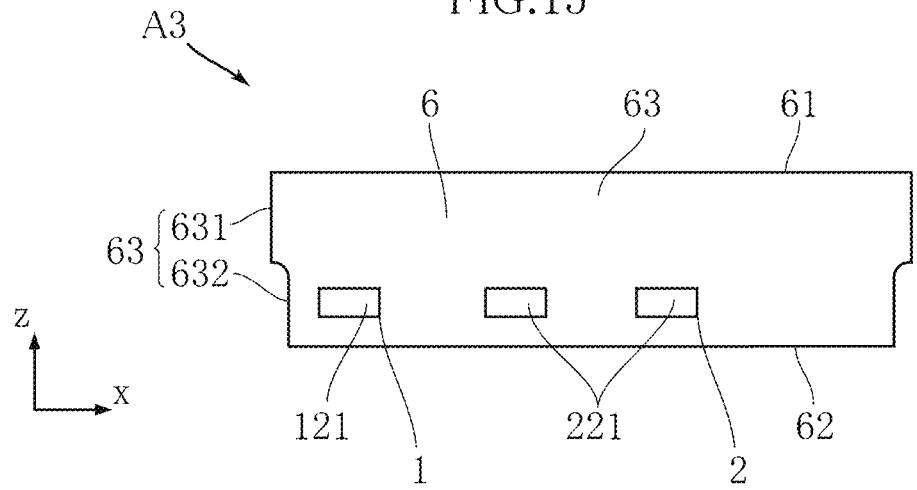
FIG. 15 is a front view showing a semiconductor device according to a third embodiment of the present disclosure.
Figure 16:
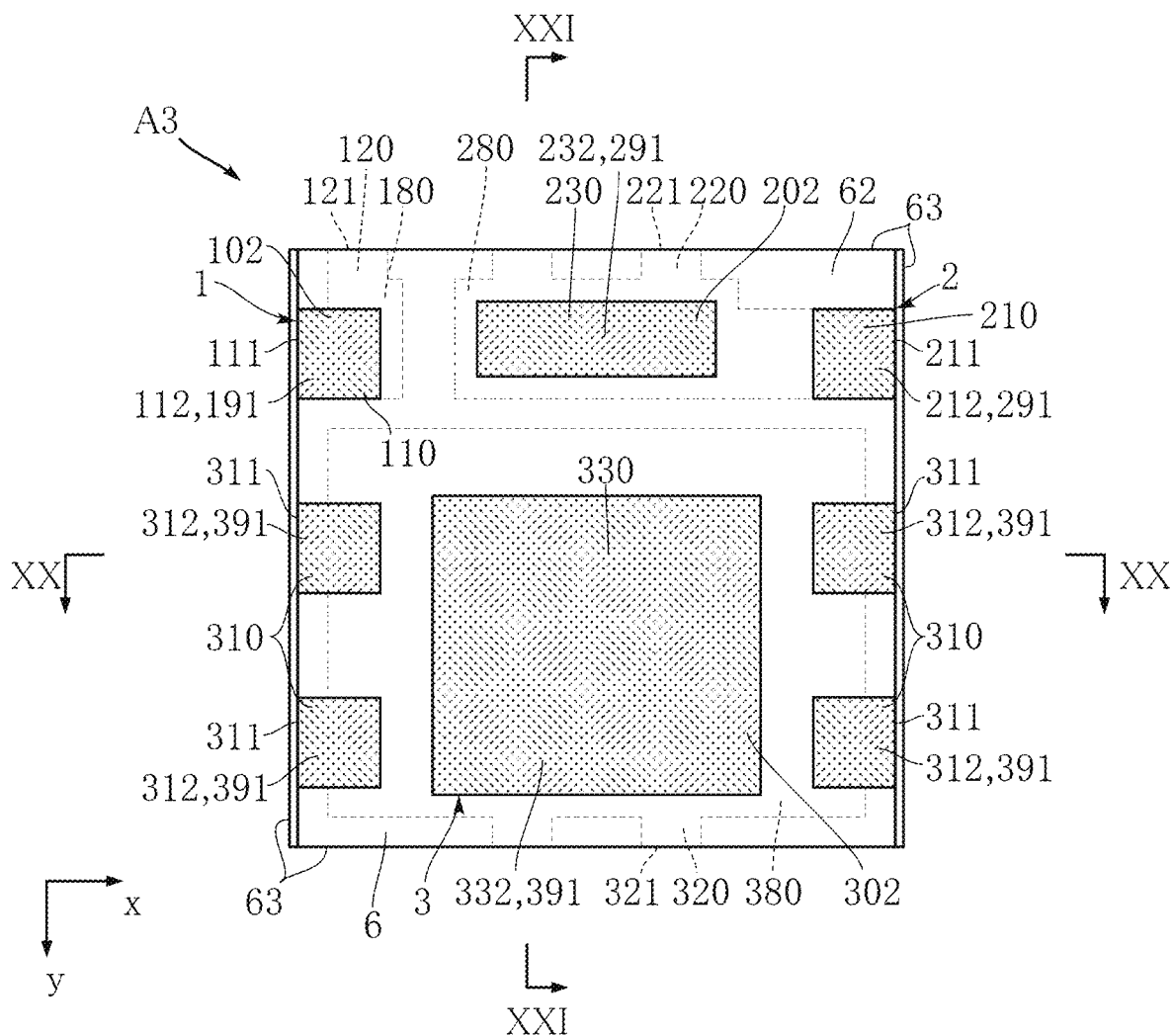
FIG. 16 is a bottom view showing the semiconductor device according to the third embodiment of the present disclosure.
Figure 17:
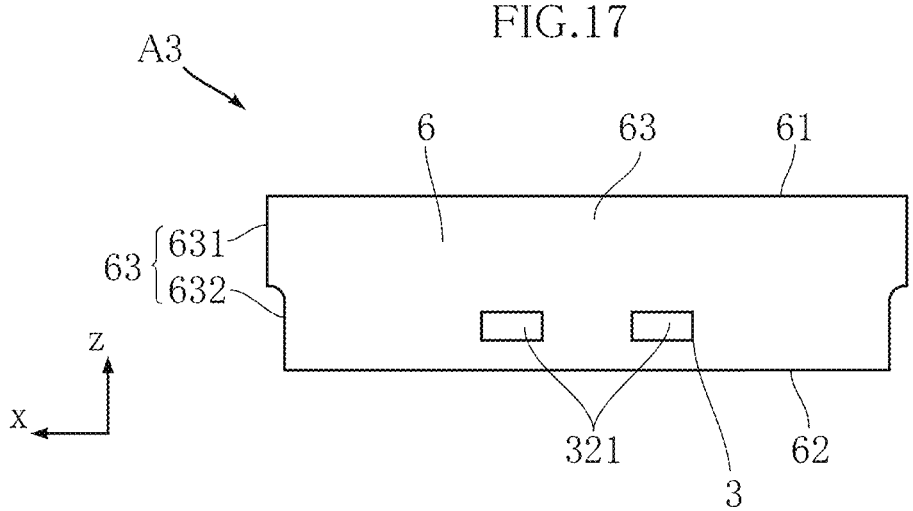
FIG. 17 is a rear view showing the semiconductor device according to the third embodiment of the present disclosure.
Figure 18:
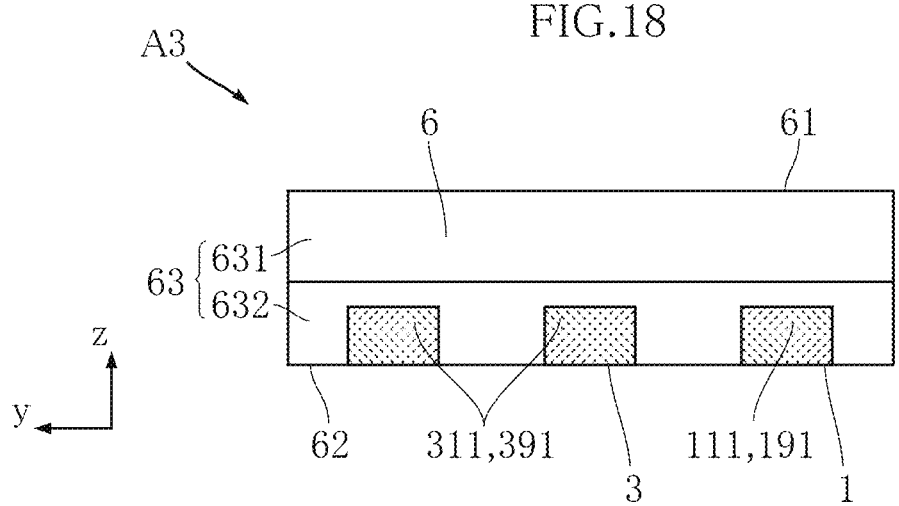
FIG. 18 is a left-side view showing the semiconductor device according to the third embodiment of the present disclosure.
Figure 19:
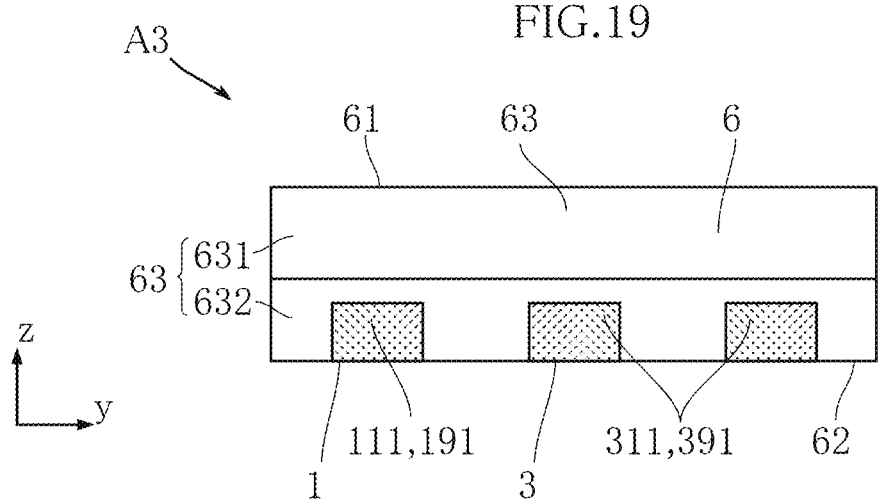
FIG. 19 is a right-side view showing the semiconductor device according to the third embodiment of the present disclosure.
Figure 20:
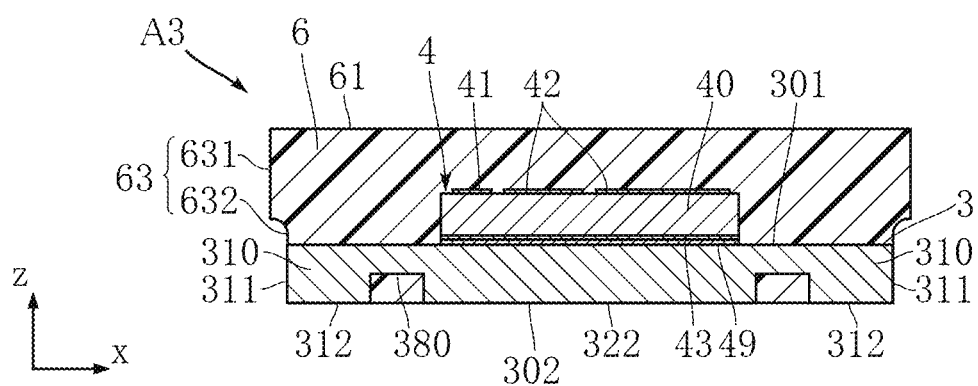
FIG. 20 is a cross-sectional view taken along line XX-XX in FIG. 16.
Figure 21:
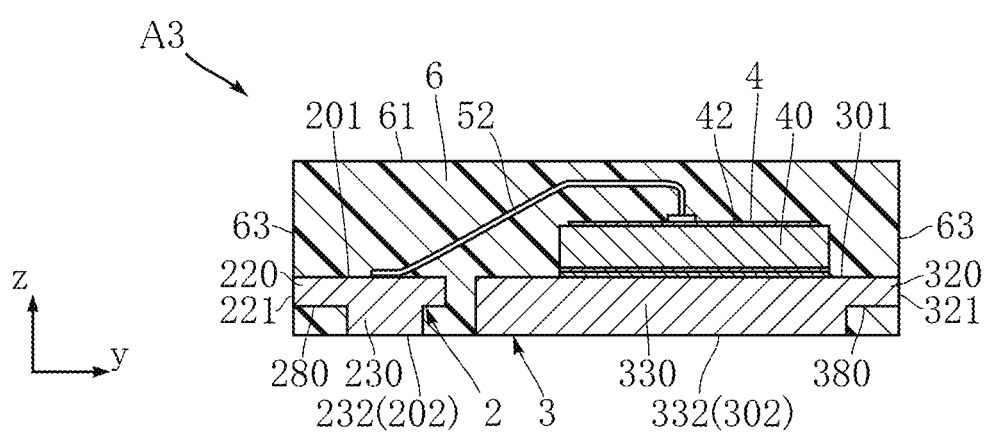
FIG. 21 is a cross-sectional view taken along line XXI-XXI in FIG. 16.

FIG. 15 is a front view showing the semiconductor device A3. FIG. 16 is a bottom view showing the semiconductor device A3. FIG. 17 is a rear view showing the semiconductor device A3. FIG. 18 is a left-side view showing the semiconductor device A3. FIG. 19 is a right-side view showing the semiconductor device A3. FIG. 20 is a cross-sectional view taken along line XX-XX of FIG. 16. FIG. 21 is a cross-sectional view taken along line XXI-XXI of FIG. 16. Note that the plan view showing the semiconductor device A3 is the same as FIG. 1.

In the present embodiment, the first plating layer 191 and the second plating layer 291 are not formed on the connecting end face 121 and the connecting end faces 221, as shown in FIG. 15. The connecting end face 121 and the connecting end faces 221 are not connected to the reverse surface 102 and the reverse surface 202.

Further, the third plating layer 391 is not formed on the connecting end faces 321 shown in FIG. 17. The connecting end faces 321 are not connected to the reverse surface 302.

On the other hand, the first plating layer 191 and the third plating layer 391 are formed on the terminal end face 111 and the terminal end faces 311, as shown in FIGS. 18 and 19. The terminal end face 111 and the terminal end faces 311 are connected to the reverse surface 102 and the reverse surface 302, respectively.

The sealing-resin side surface 63 shown in FIGS. 18 and 19 includes a first portion 631 and a second portion 632. As shown in FIG. 20, the first portion 631 is located closer to the obverse surface 61 in the z direction, and is located more outward, as viewed in the z direction, than the terminal end face 111 and the terminal end faces 311 on which the first plating layer 191 and the third plating layer 391 are formed. The second portion 632 is located closer to the reverse surface 62 than the first portion 631 in the z direction. The second portion 632 is smoothly connected to the terminal end face 111 and the terminal end faces 311 on which the first plating layer 191 and the third plating layer 391 are formed. An upper portion of the second portion 632 in the z direction forms a concave curved surface. The first portion 631 and the second portion 632 are connected at an angle.

The following describes a method for manufacturing the semiconductor device A3, with reference to FIGS. 22 to 26.

Figure 22:
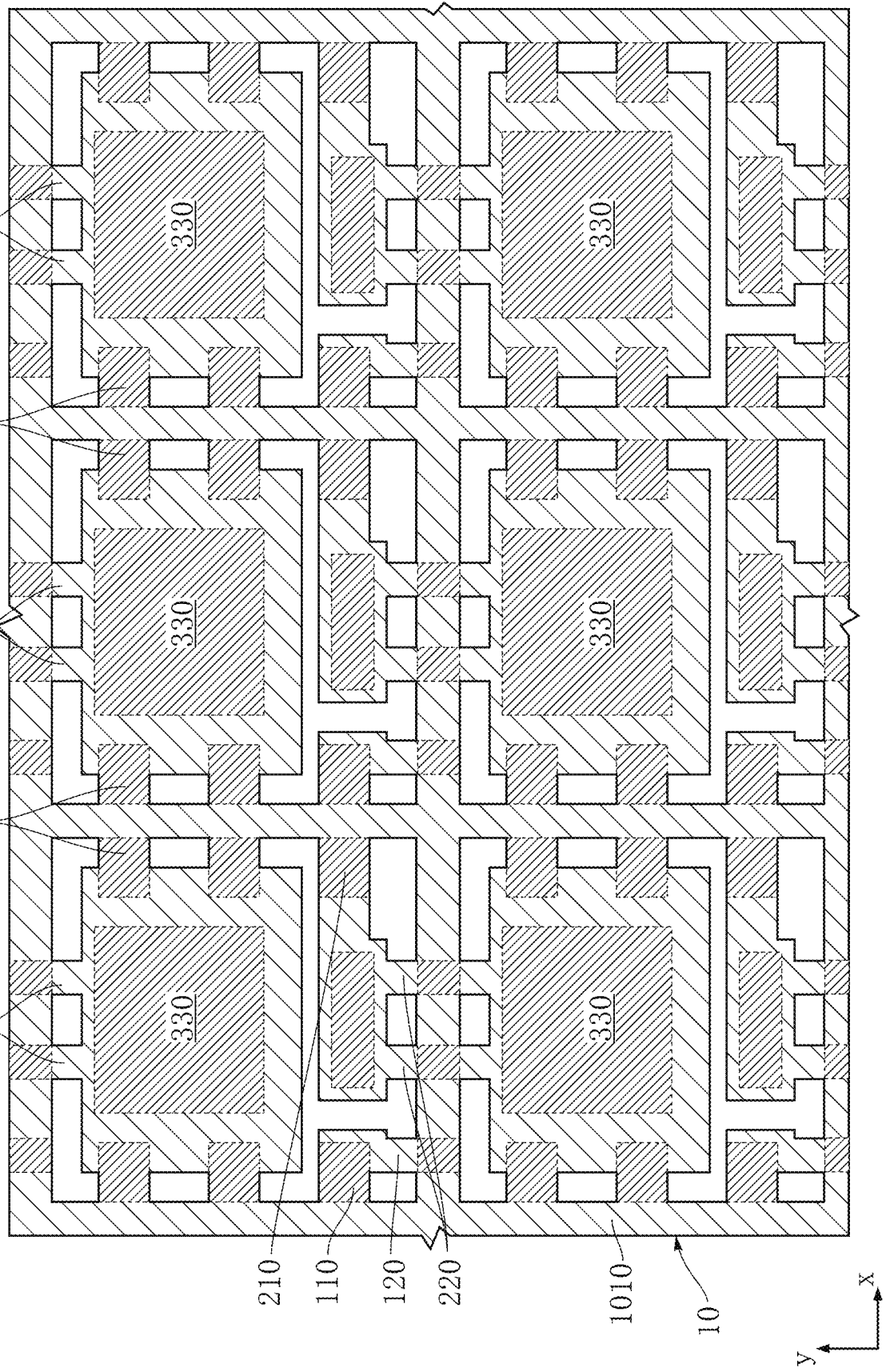
FIG. 22 is a plan view showing a method for manufacturing the semiconductor device according to the third embodiment of the present disclosure.

First, a lead frame 10 is prepared as shown in FIG. 22. This lead frame has the same structure as the lead frame 10 shown in FIG. 10, and has a size and shape that allows for manufacturing of a plurality of semiconductor devices A3.

Figure 23:
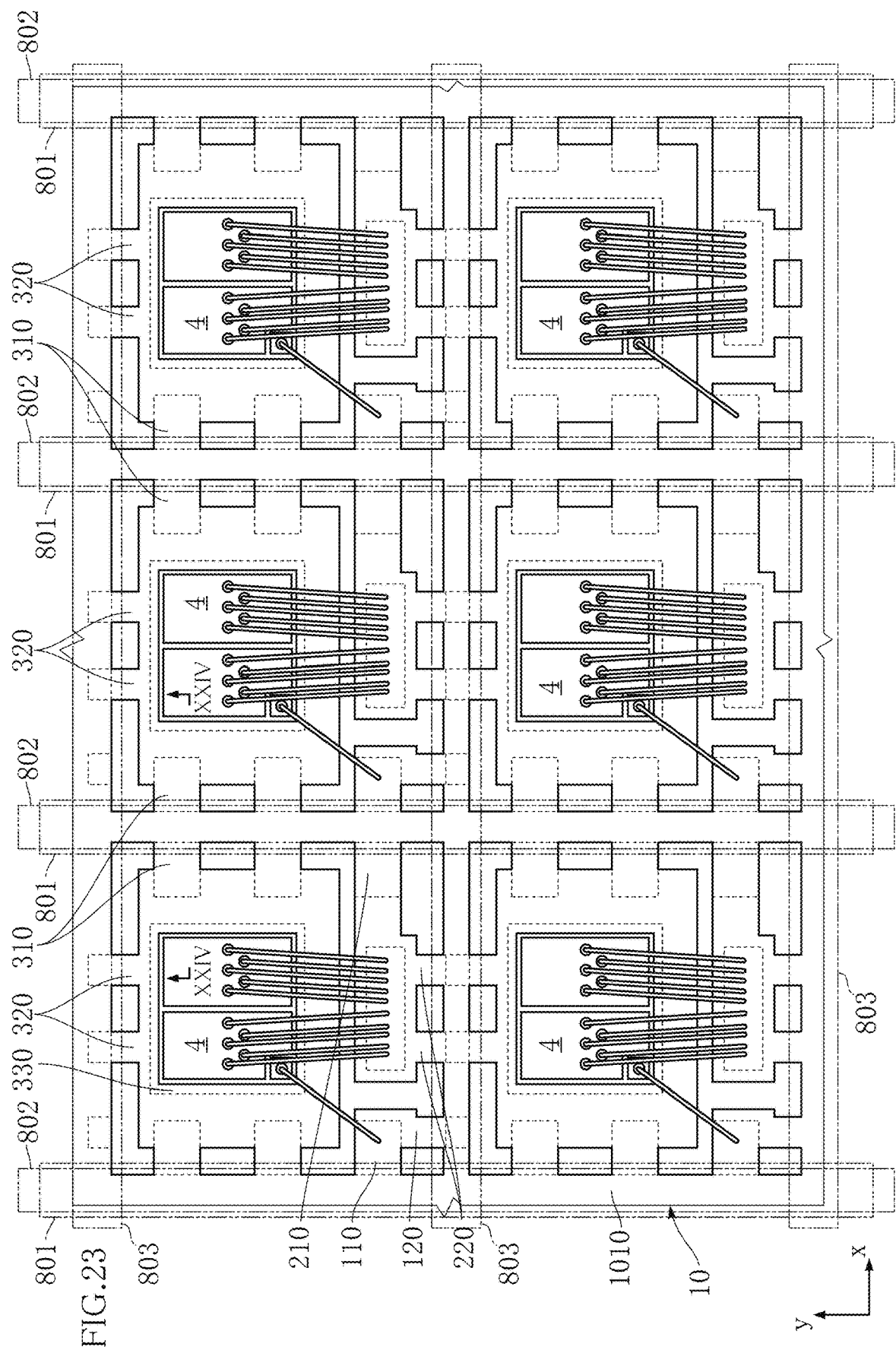
FIG. 23 is a plan view showing a method for manufacturing the semiconductor device according to the third embodiment of the present disclosure.
Figure 24:
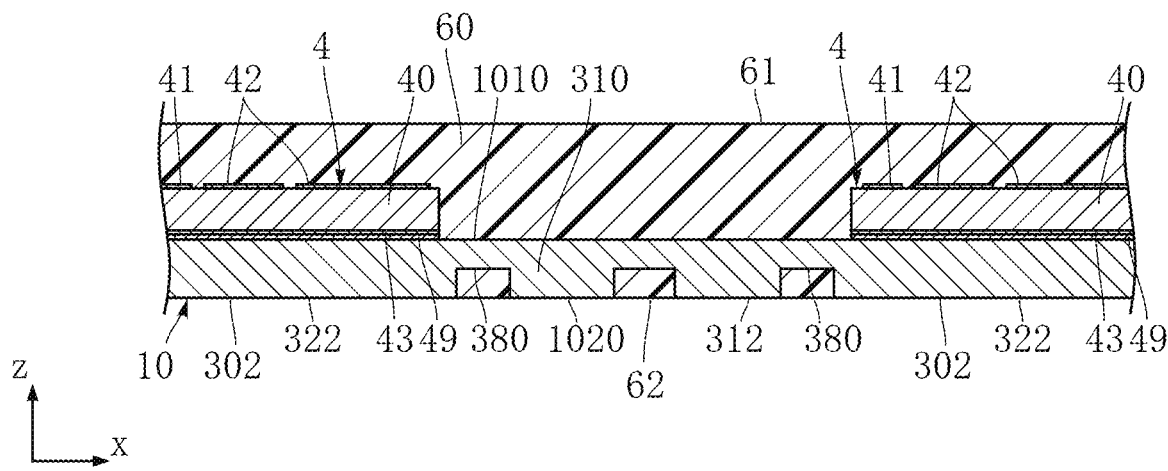
FIG. 24 is a partial cross-sectional view taken along line XXIV-XXIV in FIG. 23.

Next, for each semiconductor device A3, a semiconductor element 4 is bonded to an element bonding portion 330 of the lead frame 10 with a conductive bonding member 49, as shown in FIGS. 23 and 24. Also, as with the case shown in FIG. 11, a first wire 51 is bonded to a first electrode 41 and a terminal portion 110, and second wires 52 are bonded to second electrodes 42 and a wire-bonding portion 230. Next, a sealing material, which is not shown in figures, is cured to thereby form a sealing resin 60 (not shown) that covers a part of the lead frame 10, as well as the semiconductor element 4, the first wire 51, and the second wires 52. In the present embodiment, the sealing resin 60 is formed on the entire region shown in FIG. 23.

Figure 25:
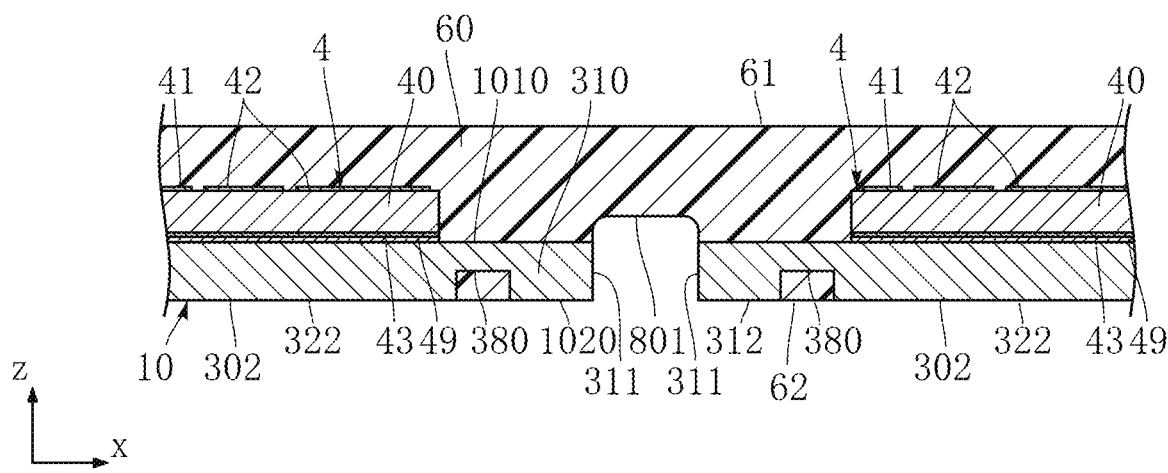
FIG. 25 is a partial cross-sectional view showing a step subsequent to the step of FIG. 24.

Next, a slit 801 is formed as shown in FIGS. 23 and 25. The slit 801 is provided between element bonding portions 330 that are adjacent to each other in the x direction, and is elongated in the y direction. The slit 801 is open at least at the side of the reverse surface 62. In the illustrated example, the slit 801 is open only at the side of the reverse surface 62, and does not reach the sealing-resin obverse surface 61. Note that the depth of the slit 801 is greater than the thickness of the lead frame 10. As a result of the slit 801 being formed, a terminal end face 111 and terminal end faces 311 as shown in FIGS. 18 and 19 are formed.

Next, a first plating layer 191 and a third plating layer 391 are formed on the terminal end face 111 and the terminal end faces 311 which are exposed from the sealing resin 60 due to the slit 801. The first plating layer 191 and the third plating layer 391 are formed in the same manner as in the method for manufacturing the semiconductor device A1 described above. Note that in this process, the first plating layer 191 and the third plating layer 391 are also formed at the side of the reverse surface 62.

Figure 26:
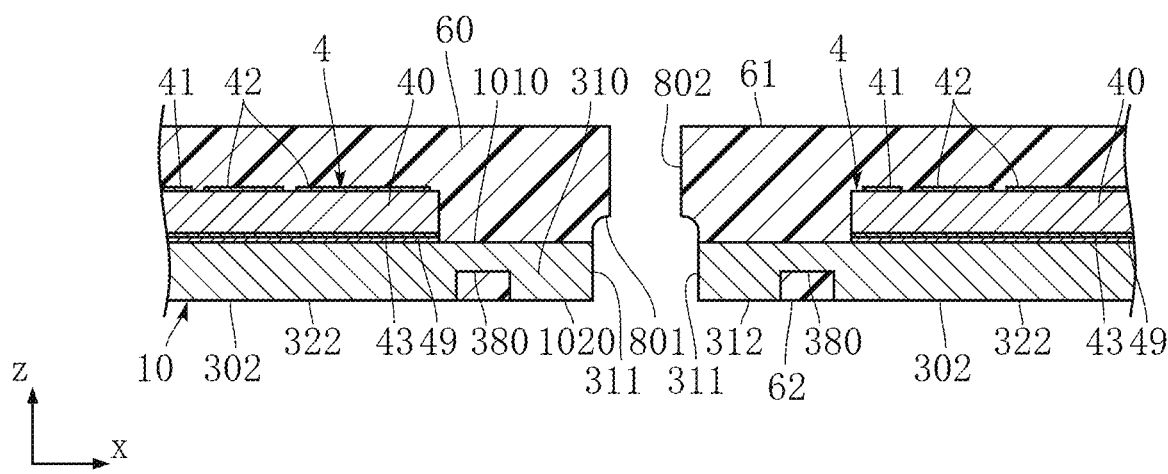
FIG. 26 is a partial cross-sectional view showing a step subsequent to the step of FIG. 25.

Next, as shown in FIGS. 23 and 26, the lead frame 10 and the sealing resin 60 are cut along a cut line 802 and a cut line 803. The cut line 802 is parallel to the slit 801, narrower than the slit 801, and included in the slit 801 as viewed in the z direction. On the other hand, the cut line 803 is located between element bonding portions 330 adjacent to each other in the y direction, and extends along the x direction. Cutting along these lines yields a plurality of semiconductor devices A3. Note that in each semiconductor device A3, the second portion 632 is a trace of the slit 801, and the first portion 631 is a trace of the cut along the cut line 802. Also note that the first plating layer 191, a second plating layer 291, and the third plating layer 391 are not formed on a connecting end face 121, connecting end faces 221, and connecting end faces 321 which are formed by the cut along the cut line 803.

Such an embodiment can also enhance the mounting strength of the semiconductor device A3. The connecting end face 121, the connecting end faces 221, and the connecting end faces 321, which are not connected to the reverse surface 102, the reverse surface 202, and the reverse surface 302, are not used as portions to be bonded by soldering or the like when the semiconductor device A3 is mounted. Accordingly, although the first plating layer 191, the second plating layer 291, and the third plating layer 391 is not formed on these portions, the mounting strength of the semiconductor device A3 is unlikely to deteriorate.

In the state shown in FIG. 25, the lead frame 10 and the sealing resin 60 are connected as a whole, and have no through-holes. Accordingly, the lead frame 10 and the sealing resin 60 maintain a high stiffness when, for example, the first plating layer 191, the second plating layer 291 and the third plating layer 391 are formed, thus allowing the manufacturing process to be performed reliably and smoothly.

Also, when a plating solution is applied to the terminal end face 111 and the terminal end faces 311 exposed at the slit 801 so as to form the first plating layer 191 and the third plating layer 391, the plating solution can smoothly penetrate along the slit 801 by capillary action.

It is possible to manufacture the semiconductor device A3 by a method in which the slit 801 is formed to penetrate in the z direction. In the semiconductor device A3 formed by this method, the sealing-resin side surfaces 63 are flat and do not have the first portions 631 and the second portions 632.

Figure 27:
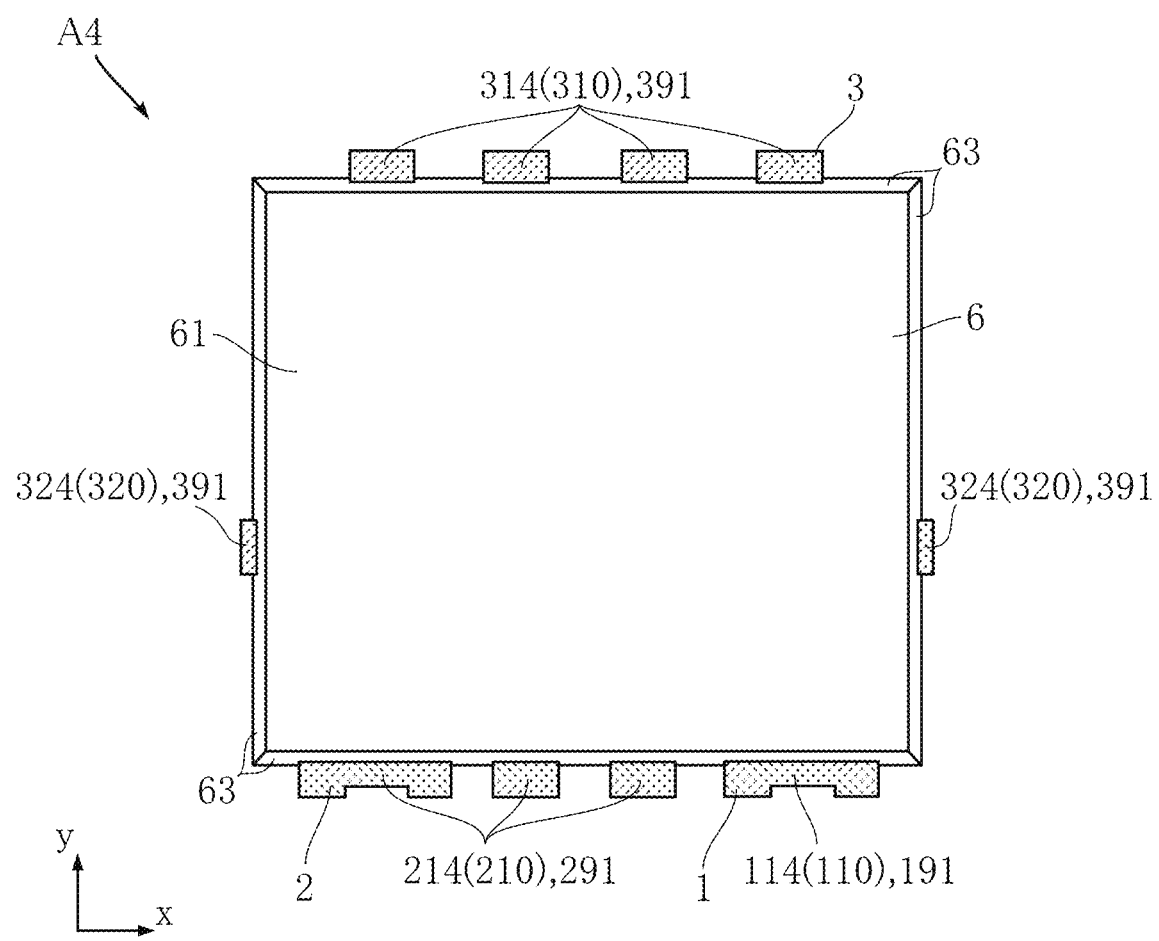
FIG. 27 is a plan view showing a semiconductor device according to a fourth embodiment of the present disclosure.
Figure 28:
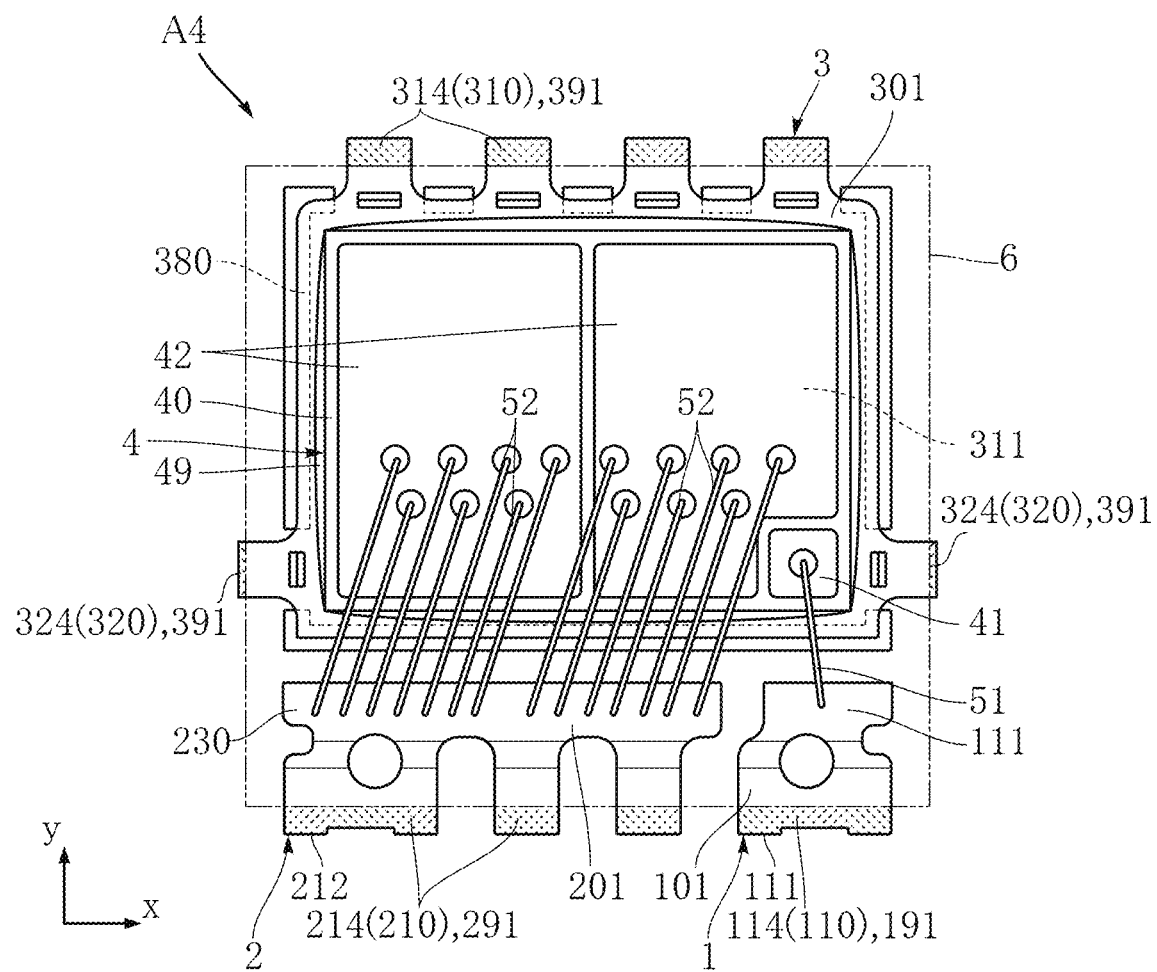
FIG. 28 is a plan view showing the semiconductor device according to the fourth embodiment of the present disclosure.
Figure 29:
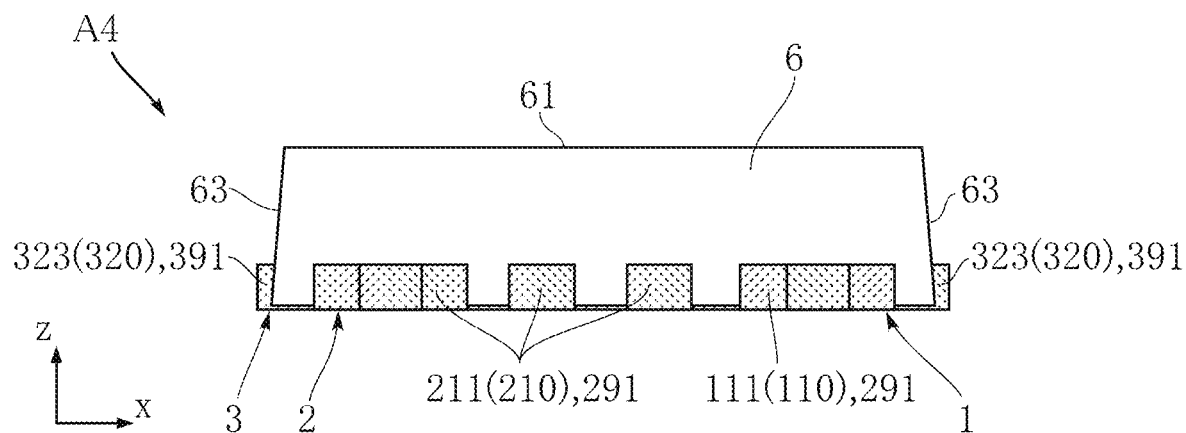
FIG. 29 is a front view showing the semiconductor device according to the fourth embodiment of the present disclosure.
Figure 30:
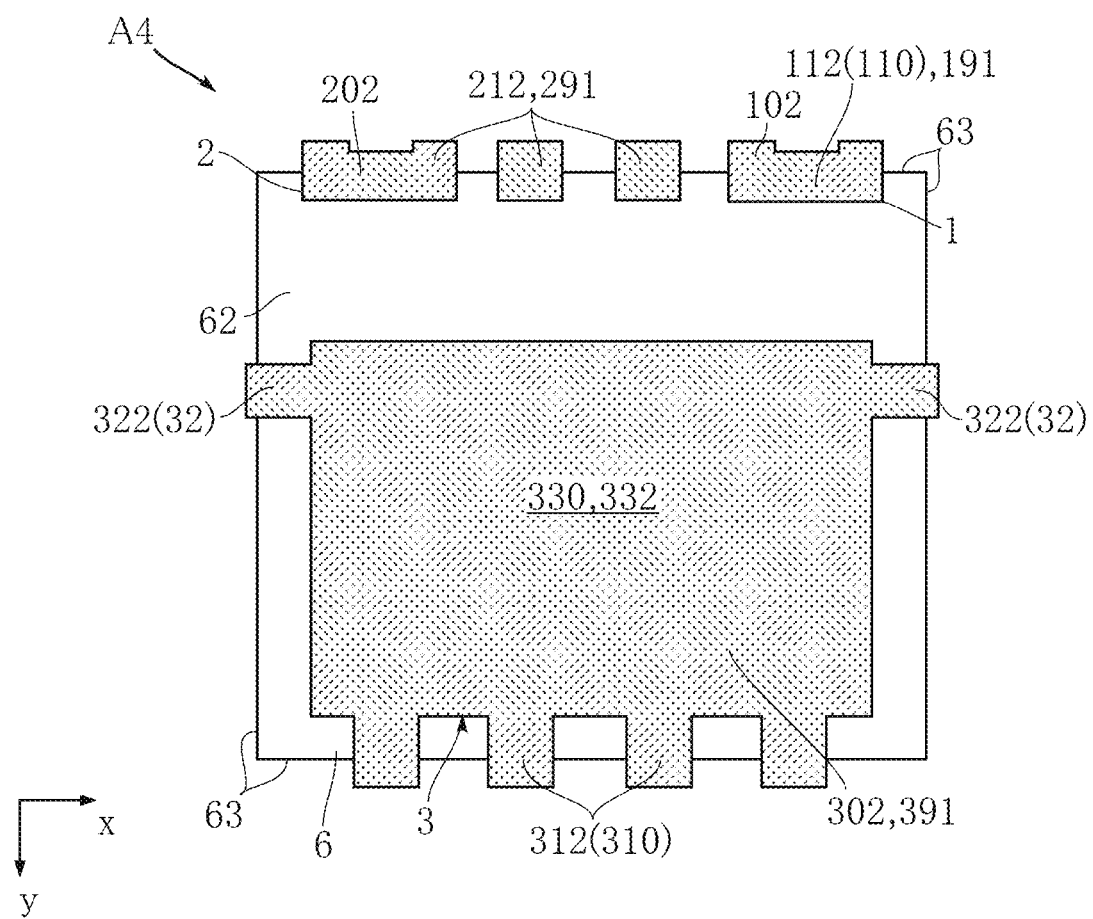
FIG. 30 is a bottom view showing the semiconductor device according to the fourth embodiment of the present disclosure.
Figure 31:
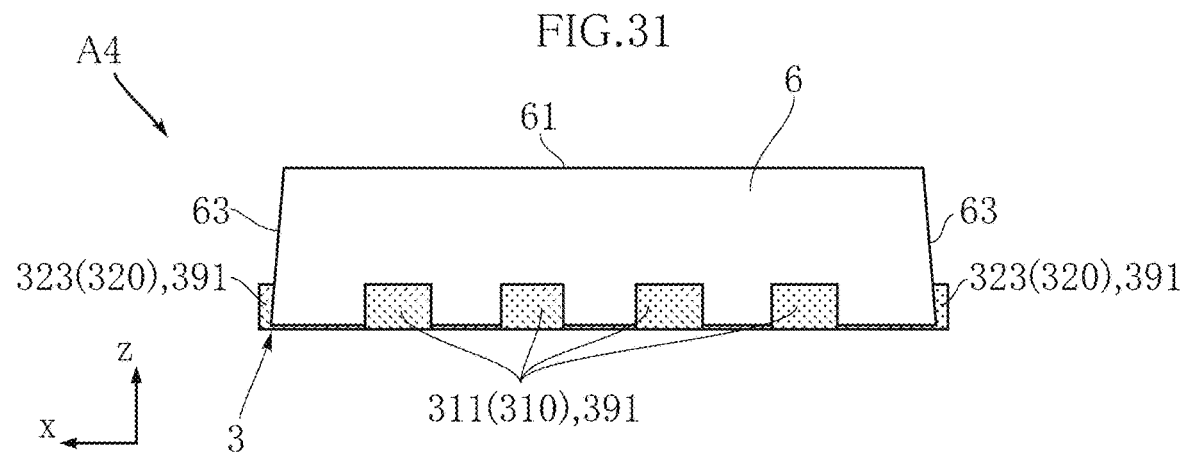
FIG. 31 is a rear view showing the semiconductor device according to the fourth embodiment of the present disclosure.
Figure 32:
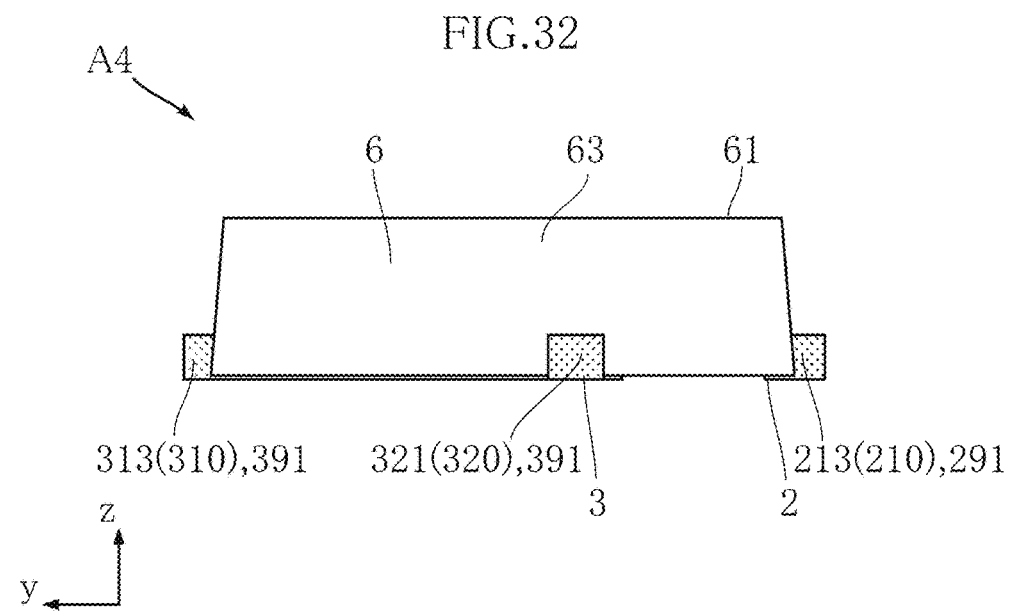
FIG. 32 is a left-side view showing the semiconductor device according to the fourth embodiment of the present disclosure.
Figure 33:
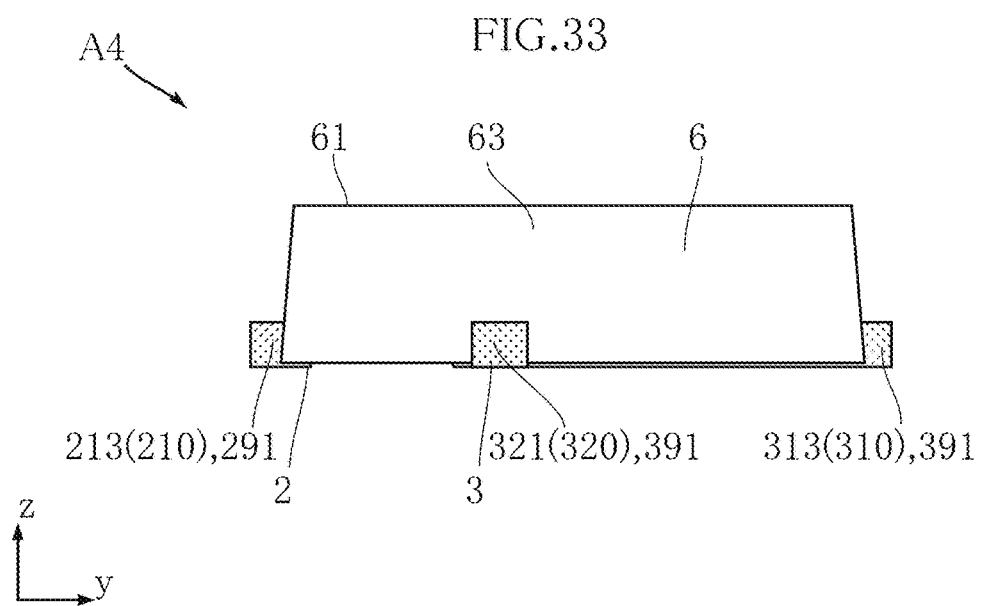
FIG. 33 is a left-side view showing the semiconductor device according to the fourth embodiment of the present disclosure.

FIGS. 27 to 33 show a semiconductor device A4 according to a fourth embodiment of the present disclosure. FIG. 27 is a plan view showing the semiconductor device A4. FIG. 28 is a plan view showing the semiconductor device A4. FIG. 29 is a front view showing the semiconductor device A4. FIG. 30 is a bottom view showing the semiconductor device A4. FIG. 31 is a rear view showing the semiconductor device A4. FIG. 32 is a left-side view showing the semiconductor device according to the fourth embodiment of the present disclosure. FIG. 33 is a right-side view showing the semiconductor device according to the fourth embodiment of the present disclosure. In FIG. 27 and FIGS. 29 to 33, dotted areas indicate a first plating layer 191, a second plating layer 291, and a third plating layer 391.

In the present embodiment, a terminal portion 110, terminal portions 210, terminal portions 310 and connecting portions 320 protrude from a sealing resin 6 as viewed in the z direction. As with the above-described embodiments, the first plating layer 191, the second plating layer 291, and the third plating layer 391 are formed on all parts of a first wire-bonding lead 1, a second wire-bonding lead 2, and a primary lead 3 except for parts covered with the sealing resin 6, or in other words, on all parts of the first lead 1, the second lead 2, and the primary lead 3 exposed from the sealing resin 6.

The terminal portion 110 has a terminal end face 111, a terminal reverse surface 112, and a terminal obverse surface 114. The terminal end face 111 faces in the y direction. The terminal reverse surface 112 is a part of a reverse surface 102. The terminal obverse surface 114 is a part of an obverse surface 101. The terminal reverse surface 112 and the terminal obverse surface 114 are connected by a pair of terminal side surfaces facing oppositely in the x direction. The first plating layer 191 is formed on the terminal end face 111, the terminal reverse surface 112, the terminal side surfaces, and the terminal obverse surface 114.

Each of the terminal portions 210 has a terminal end face 211, a terminal reverse surface 212, and a terminal obverse surface 214. The terminal end face 211 faces in the y direction. The terminal reverse surface 212 is a part of the reverse surface 202 of the lead 2. The terminal obverse surface 214 is a part of the obverse surface 201 of the lead 2. The terminal reverse surface 212 and the terminal obverse surface 214 are connected by a pair of terminal side surfaces of the lead 2 facing oppositely in the x direction. The second plating layer 291 is formed on the terminal end face 211, the terminal reverse surface 212, the terminal side surfaces, and the terminal obverse surface 214.

Each of the terminal portions 310 of the lead 3 has a terminal end face 311, a terminal reverse surface 312, and a terminal obverse surface 314. The terminal end face 311 faces in the y direction. The terminal reverse surface 312 is a part of the reverse surface 302 of the lead 3. The terminal obverse surface 314 is a part of the obverse surface 301 of the lead 3. The terminal reverse surface 312 and the terminal obverse surface 314 are connected by a pair of terminal side surfaces of the lead 3 facing oppositely in the x direction. The third plating layer 391 is formed on the terminal end face 311, the terminal reverse surface 312, the third terminal side surfaces, and the terminal obverse surface 314.

Each of the connecting portions 320 of the lead 3 has a connecting end face 321, a connecting reverse surface 322, a pair of connecting side surfaces 323, and a connecting obverse surface 324. The connecting end face 321 faces in the x direction. The connecting reverse surface 322 is a part of the reverse surface 302 of the lead 3. The connecting obverse surface 324 is a part of the obverse surface 301 of the lead 3. The connecting side surfaces 323 connect the connecting reverse surface 322 and the connecting obverse surface 324 and face in the y direction. The third plating layer 391 is formed on the connecting end face 321, the connecting reverse surface 322, the connecting side surfaces, and the connecting obverse surface 324.

Such an embodiment can also enhance the mounting strength of the semiconductor device A4. As is evident from the present embodiment, the forming of the first to third plating layers 191, 291, 391 can also improve the mounting strength of the device in which protruding portions (such as terminal portions 110, 210, 310, and connecting portions 320) from the sealing resin 6 are provided.

The semiconductor device according to the present disclosure and the method for manufacturing the same are not limited to the embodiments described above. Various design changes can be made to the specific configurations of the semiconductor device and the method for manufacturing the same.

The invention claimed is:

1. A semiconductor device comprising:
   a first lead having an obverse surface and a reverse surface that are spaced apart from each other in a thickness direction;
   a semiconductor element provided with at least one electrode and supported by the first lead;
   a second lead adjacent to the first lead;
   a sealing resin covering a part of the first lead, a part of the second lead, and the semiconductor element, the sealing resin being rectangular in plan view and including a first side surface, a second side surface opposite to the first side surface, a third side surface other than the first and the second side surface, and a bottom surface;
   a wire connecting the second lead and the electrode of the semiconductor element to each other; and
   a plurality of wires each connecting the semiconductor element and the second lead to each other,
   wherein the first lead comprises a plurality of exposed portions that are exposed from the sealing resin and include a first exposed portion exposed from the first side surface of the sealing resin, a second exposed portion exposed from the second side surface of the sealing resin, and a third exposed portion exposed from the bottom surface of the sealing resin,
   the second lead is electrically connected to the electrode of the semiconductor element,
   the second lead includes an exposed portion exposed from the third side surface of the sealing resin, and
   the first side surface of the sealing resin includes a first section and a second section, the first section being disposed outward with respect to the second section in plan view, the first exposed portion of the first lead being located in the second section of the first side surface of the sealing resin.

2. The semiconductor device according to claim 1, wherein the first lead comprises a thick portion overlapping with the semiconductor element in plan view, and the first exposed portion is smaller in size along a straight line parallel to the first side surface of the sealing resin in plan view than the thick portion of the first lead.

3. The semiconductor device according to claim 1, wherein the first lead comprises a plurality of exposed portions, including the first exposed portion, that are exposed from the first side surface of the sealing resin.

4. The semiconductor device according to claim 3, wherein the first lead comprises a plurality of exposed portions, including the second exposed portion, that are exposed from the second side surface of the sealing resin.

5. The semiconductor device according to claim 1, wherein each of the first exposed portion and the second exposed portion is formed with a plating layer.

6. The semiconductor device according to claim 1, wherein the second lead is smaller in area in plan view than the first lead.

7. The semiconductor device according to 1, wherein the second lead is disposed closer to the first side surface of the sealing resin than to the second side surface of the sealing resin.

8. The semiconductor device according to claim 1, wherein the second lead comprises an additional exposed portion exposed from the first side surface of the sealing resin.

9. The semiconductor device according to claim 1, wherein the first lead comprises a linear edge facing the second lead in plan view, and the second lead is elongated along the linear edge.

10. The semiconductor device according to claim 9, wherein the second lead comprises an additional exposed portion exposed from the second side surface of the sealing resin.

11. The semiconductor device according to claim 9, wherein the sealing resin has an imaginary center line perpendicular to the third side surface of the sealing resin in plan view, and the imaginary center line extends through the semiconductor element and the second lead in plan view.

12. The semiconductor device according to claim 1, the at least one electrode of the semiconductor element comprises a first electrode and a second electrode, and the plurality of wires comprise a first wire bonded to the first electrode and a second wire bonded to the second electrode.

13. The semiconductor device according to claim 1, wherein the sealing resin comprises a fourth side surface opposite to the third side surface, and the first lead comprises a fourth exposed portion exposed from the fourth side surface of the sealing resin.

14. The semiconductor device according to claim 1, wherein the exposed portion of the second lead is spaced apart from the first and the second side surface of the sealing resin in plan view.

15. The semiconductor device according to claim 1, wherein the first lead is greater in size along a straight line parallel to the first side surface of the sealing resin in plan view than the second lead.

16. The semiconductor device according to claim 1, wherein the plurality of exposed portions of the first lead are formed integral with a remaining portion of the first lead.

17. The semiconductor device according to claim 1, wherein the first lead comprises a linear edge facing the second lead in plan view, and
the first exposed portion and the second exposed portion are aligned with each other along an imaginary line that is parallel to and spaced apart from the linear edge of the first lead in plan view.

18. The semiconductor device according to claim 1, wherein the second lead includes a plurality of exposed portions exposed from the bottom surface of the sealing resin.

* * * * *